United States Patent
Saitou et al.

(10) Patent No.: US 8,784,956 B2
(45) Date of Patent: Jul. 22, 2014

(54) RESIN COMPOSITION FOR FORMING RECEIVING LAYER, AND RECEIVING SUBSTRATE; PRINTED MATTER, CONDUCTIVE PATTERN, AND ELECTRIC CIRCUIT PRODUCED BY USING THE RESIN COMPOSITION

(75) Inventors: Yukie Saitou, Osaka (JP); Wataru Fujikawa, Osaka (JP); Jun Shirakami, Osaka (JP)

(73) Assignee: Dic Corporation, Tokyo (JP)

( * ) Notice: Subject to any disclaimer, the term of this patent is extended or adjusted under 35 U.S.C. 154(b) by 0 days.

(21) Appl. No.: 13/881,254

(22) PCT Filed: Aug. 28, 2012

(86) PCT No.: PCT/JP2012/071683
§ 371 (c)(1),
(2), (4) Date: Apr. 24, 2013

(87) PCT Pub. No.: WO2013/035582
PCT Pub. Date: Mar. 14, 2013

(65) Prior Publication Data
US 2013/0260114 A1    Oct. 3, 2013

(30) Foreign Application Priority Data
Sep. 9, 2011 (JP) ................................ 2011-197080

(51) Int. Cl.
*B41M 5/00* (2006.01)
*B41M 5/52* (2006.01)
*C09D 175/04* (2006.01)
*C08G 18/10* (2006.01)
*C08L 23/08* (2006.01)

(52) U.S. Cl.
CPC ............. *B41M 5/5218* (2013.01); *B41M 5/52* (2013.01); *B41M 5/5254* (2013.01); *C09D 175/04* (2013.01); *C08G 18/10* (2013.01); *C08L 23/0815* (2013.01); *C08L 2205/02* (2013.01)
USPC ...................... 428/32.34; 428/423.1; 523/160

(58) Field of Classification Search
CPC .... B41M 5/5218; B41M 5/52; B41M 5/5254; C09D 175/04; C08G 18/10; C08L 23/0815; C08L 2205/02
USPC ............................ 428/32.34, 423.1; 523/160
See application file for complete search history.

(56) References Cited

U.S. PATENT DOCUMENTS

| 4,368,281 | A  | * | 1/1983  | Brummett et al. ............ 523/458 |
| 4,770,921 | A  | * | 9/1988  | Wacker et al. ................ 428/209 |
| 6,716,493 | B1 |   | 4/2004  | Notsu et al. |
| 2003/0035038 | A1 | | 2/2003 | Nakajima |
| 2004/0081774 | A1 | | 4/2004 | Notsu et al. |
| 2005/0287689 | A1 | * | 12/2005 | Iwaki et al. ..................... 438/22 |
| 2012/0094090 | A1 | * | 4/2012  | Yamazaki et al. ......... 428/195.1 |
| 2012/0164400 | A1 | * | 6/2012  | Nagahama ................ 428/195.1 |

FOREIGN PATENT DOCUMENTS

| JP | 2001-232936 A | 8/2001 |
| JP | 2002-370443 A | 12/2002 |
| JP | 2009-049124 A | 3/2009 |
| JP | 2011-042046 A | 3/2011 |
| WO | WO 2011/004675 A1 * | 1/2011 ............ C09D 11/00 |

OTHER PUBLICATIONS

An International Search Report, mailed Oct. 23, 2012, which issued during the prosecution of International Application No. PCT/JP2012/071683, which corresponds to the present application.

* cited by examiner

*Primary Examiner* — Betelhem Shewareged
(74) *Attorney, Agent, or Firm* — McDermott Will & Emery LLP

(57) ABSTRACT

An object to be achieved by the present invention is to provide a resin composition for forming a receiving layer, the resin composition being capable of forming, among receiving layers that can carry a fluid such as an ink, a receiving layer having excellent, adhesion to various types of supports and capable of forming a receiving layer which has excellent printing properties without causing bleeding of a fluid such as an ink. The present invention relates to a resin composition for forming a receiving layer, the resin composition containing a urethane resin (A), a vinyl polymer (B), and an aqueous medium (C), in which the urethane resin (A) has an alicyclic structure in an amount of 2,000 to 5,500 mmol/kg relative to the total amount of the urethane resin (A), and a hydrophilic group.

17 Claims, No Drawings

RESIN COMPOSITION FOR FORMING RECEIVING LAYER, AND RECEIVING SUBSTRATE; PRINTED MATTER, CONDUCTIVE PATTERN, AND ELECTRIC CIRCUIT PRODUCED BY USING THE RESIN COMPOSITION

CROSS REFERENCE TO PRIOR APPLICATIONS

This application is a U.S. National Phase application under 35 U.S.C. §371 of International Application No. PCT/JP2012/071683, filed on Aug. 28, 2012 and claims benefit of priority to Japanese Patent Application No. 2011-197080, filed on Sep. 9, 2011. The International Application was published in Japanese on Mar. 14, 2013 as WO 2013/035582 A1 under PCT Article 21(2). The contents of the above applications are hereby incorporated by reference.

TECHNICAL FIELD

The present invention relates to a resin composition for forming a receiving layer that can receive a fluid such as an ink, for example, ejected by a printing method such as an ink-jet printing method, a receiving substrate, and printed matter such as a conductive pattern.

BACKGROUND ART

Recently, in the ink-jet printing industry, which has been significantly growing, the realization of high-performance ink-jet printers, the improvement of inks, etc. have markedly progressed, and it has become possible to obtain very fine and sharp images which have excellent printing properties and which are substantially equivalent to silver halide prints even in ordinary households. Therefore, ink-jet printers are not only used in homes but have also started to be used in various fields such as in the production of large advertisement boards.

The improvement in the image quality of ink-jet printed matter is mainly achieved by not only the improvement in the performance of printers but also the improvement in printing inks. Specific examples of the improvement in printing inks include studies on the selection of solvents in inks and the selection of dyes or pigments in inks. Recently, pigment inks, which are known as inks having good color-developing properties that are substantially equivalent to those of dye inks, have attracted attention.

However, even in the case where such a pigment ink having a good color-developing property is used, it may be difficult to form a printed image having a high color density and excellent printing properties because bleeding of the ink or the like may occur depending on the composition of an ink-receiving layer. Furthermore, with an increase in the type of ink-jet printed matter, various materials have been used as a support on which the ink-receiving layer is provided. Under this circumstance, an existing ink-receiving layer may be separated from a support with time because, for example, the ink-receiving layer does not have sufficient adhesion to a plastic film such as a polyethylene terephthalate film.

In addition, the use of known printing methods such as the ink-jet printing method and a screen printing method has been studied for the purpose of forming a conductive pattern of an electronic circuit or the like. This is because, with the recent requirements for improving the performance, reducing the size, and reducing the thickness of electronic devices, an increase in integration density and a reduction in thickness have also been strongly required for electronic circuits and integrated circuits that are used in the electronic devices.

A specific method for producing such a conductive pattern of an electronic circuit or the like includes printing a conductive ink containing a conductive substance such as silver on a surface of a support by an ink-jet printing method, a screen printing method, or the like, then drying the conductive ink, and performing heating or light irradiation, as required.

However, even when the conductive ink is printed directly on a surface of a support, the conductive ink does not readily adhere to the surface of the support and is easily separated from the support, which may result in, for example, a disconnection in an electronic circuit that is finally obtained. In particular, a support composed of a polyimide resin, a polyethylene terephthalate resin, or the like has flexibility and thus enables the production of flexible devices that can be bent. However, in particular, an ink, a resin, or the like does not readily adhere to such a support composed of a polyimide resin or the like and is easily separated from the support, which may result in a disconnection in an electronic circuit that is finally obtained and severing of electrical connection.

A known method for solving the above problem is a method for forming a conductive pattern by drawing a pattern, on an ink-receiving substrate having a latex layer thereon, using a conductive ink by a predetermined method. It is known that an acrylic resin can be used as the latex layer (refer to PTL 1).

However, an ink-receiving layer formed of the latex layer on which the conductive pattern is formed may cause bleeding of a conductive ink, unevenness of the printing thickness, etc. Accordingly, it may be difficult to form a conducting line formed of a fine line having a width of about 0.01 to 200 μm, which is generally required for realizing an increase in integration density of electronic circuits or the like.

In the formation of the conductive pattern, printed matter obtained by performing printing using a conductive ink is usually baked by heating at a temperature of about 80° C. or higher in order to provide the electrical conduction property by bringing conductive substances contained in the conductive ink into contact with each other.

However, an ink-receiving layer such as the latex layer described in PTL 1 is, for example, readily degraded by the effect of heat received in the baking step. Thus, in particular, the adhesion at the interface between the ink-receiving layer and the support tends to decrease, and separation tends to occur even when a very small force is applied.

In addition, during the baking step, the latex layer serving as the ink-receiving layer tends to be excessively swollen and deformed. Consequently, a disconnection in an electric circuit or the like and the failure of an electrical connection may occur. In addition, since the latex layer usually does not have sufficient adhesion to the support before the heating in the baking step is performed, the support may be partially separated from the ink-receiving layer before the baking step.

In the formation of the conductive pattern, a plating process is often performed on the surface of the conductive pattern using copper or another metal from the standpoint of forming a highly reliable wiring pattern that can maintain a good electrical, conduction property without the occurrence of a disconnection or the like for a long time.

However, chemical agents for plating, the chemical agents used in the plating process, and chemical agents used in a washing step of the plating process are usually strongly alkaline or acidic, and thus these chemical agents readily cause, for example, separation of the receiving layer etc. from the support. As a result, for example, a disconnection in the conductive pattern may be caused.

Accordingly, it is desired for the conductive pattern to have durability of such a level that the conductive-ink-receiving layer does not become separated from the support even when the conductive pattern is repeatedly immersed in the chemical agents and the like for a long time.

CITATION LIST

Patent Literature

PTL 1: Japanese Unexamined Patent Application Publication No. 2009-49124

SUMMARY OF INVENTION

Technical Problem

An object to be achieved by the present invention is to provide a resin composition for forming a receiving layer, the resin composition being capable of forming, among receiving layers that can carry a fluid such as an ink, a receiving layer having excellent adhesion to various types of supports and capable of forming a receiving layer which has excellent printing properties without causing bleeding of a fluid such as an ink.

A second object to be achieved by the present invention is to provide a resin composition for forming a receiving layer, the resin composition being capable of forming, among receiving layers that can carry a fluid such as a conductive ink, a receiving layer having excellent adhesion to a support, having a fine-line-forming property of drawing a fine line at such a level that, for example, an increase in integration density of electronic circuits or the like is realized without causing bleeding and repellency of the fluid, and capable of forming printed matter such as a conductive pattern having durability of such a level that a good electrical conduction property can be maintained without causing, for example, separation of a receiving layer from a support even in the case where chemical agents such as chemical agents for plating and various organic solvents adhere to the printed matter.

Solution to Problem

As a result of studies conducted in order to achieve the above objects, the inventors of the present invention found that the objects of the present invention can be achieved by using a specific polyurethane and a vinyl polymer in combination.

Specifically, the present invention relates to a resin composition for forming a receiving layer, the resin composition containing a urethane resin (A), a vinyl polymer (B), and an aqueous medium (C), in which the urethane resin. (A) has an alicyclic structure in an amount of 2,000 to 5,500 mmol/kg relative to the total amount of the urethane resin (A), and a hydrophilic group.

Advantageous Effects of Invention

According to the resin composition of the present invention for forming a receiving layer, it is possible to form a receiving layer having excellent adhesion to various types of supports and to form a printed image having excellent printing properties with a good color-developing property without causing bleeding and the like of a fluid such as a pigment ink. Accordingly, the resin composition for forming a receiving layer can be used in, for example, recording medium used for producing an advertisement, a signboard, a sign, etc. that can be installed indoors or outdoors.

Furthermore, according to the resin composition of the present invention for forming a receiving layer, it is possible to form a receiving layer having excellent adhesion between a receiving layer and a support, it is possible to provide a fine-line-forming property of drawing a fine line without causing bleeding of a conductive ink at such a level that, for example, an increase in integration density of electronic circuits or the like can be realized, and it is possible to form a receiving layer having excellent durability. Accordingly, the resin composition for forming a receiving layer can be generally used in new fields such as a printed electronics field, for example, in the formation of an electronic circuit using, for example, a conductive ink containing a conductive substance such as silver, the formation of layers and peripheral wiring that are included in an organic solar cell, an electronic book terminal, an organic electroluminescence (EL) device, an organic transistor, a flexible printed circuit board, radio-frequency identification (RFID) such as a non-contact IC card, etc., and the production of wiring of an electromagnetic wave shield, an integrated circuit, an organic transistor of a plasma display, etc.

Regarding a receiving layer formed using the resin composition of the present invention for forming a receiving layer, a fluid such as a conductive ink or a plating nucleus agent is printed on a receiving substrate of the present invention, and a cross-linked structure is then formed in the resulting ink-receiving layer by heating or the like, whereby printed matter (a plating structure) having durability at a higher level can be obtained. Specifically, it is possible to obtain printed matter (a plating structure) having durability of such a level that detachment of a conductive substance or the like contained in the fluid Thorn the surface of the receiving layer can be prevented in the plating process.

DESCRIPTION OF EMBODIMENTS

A resin composition of the present invention for forming a receiving layer contains a urethane resin (A) having an alicyclic structure in an amount of 2,000 to 5,500 mmol/kg relative to the total amount of the urethane resin (A), and a hydrophilic group; a vinyl polymer (B); an aqueous medium (C); and, if necessary, other additives.

In particular, the resin composition for forming a receiving layer can be used for forming a receiving layer that absorbs a solvent in a fluid containing a conductive substance, a pigment, or the like when the fluid contacts the receiving layer and that carries the conductive substance or the pigment.

The urethane resin (A) and the vinyl polymer (B) contained in the resin composition for forming a receiving layer may be independently present in the aqueous medium (C) or may be present in the aqueous medium (C) in the form of a composite resin particle (D).

The term "composite resin particle (D)" specifically refers to a particle in which some or all of the vinyl polymer (B) is present in a resin particle composed of the urethane resin (A). In this case, the vinyl polymer (B) may be dispersed in the urethane resin (A) in the form of plural particles. Preferably, the urethane resin (A) and the vinyl polymer (B) form a core-shell composite resin particle including the vinyl polymer (B) serving as a core layer and the urethane resin (A) having the hydrophilic group and serving as a shell layer. In particular, in the case where a conductive pattern is formed, the core-shell composite resin particle is preferably used because a surfactant, which may decrease electrical properties, need not be used. In the composite resin particle (D), preferably, the vinyl polymer (B) is substantially completely covered with the urethane resin (A), but this structure is not essential. Some of the vinyl polymer (B) may be present in the outermost part of the composite resin particle (D) as long as the effects of the present invention are not impaired.

In the case where the vinyl polymer (B) is more hydrophilic than the urethane resin (A), the composite resin particle (D) may be a composite resin particle in which some or all of the urethane resin (IQ is present in a resin particle composed of the vinyl polymer (B).

The urethane resin (A) and the vinyl polymer (B) may form a covalent bond. However, preferably, the urethane resin (A) and the vinyl polymer (B) do not form a bond.

From the standpoint of maintaining good water dispersion stability, the composite resin particles (D) preferably has an average particle diameter in the range of 5 to 100 nm. Herein, the term "average particle diameter" refers to an average particle diameter on a volume basis measured by a dynamic light scattering method, as described in Examples below.

The resin composition of the present invention for forming a receiving layer contains the urethane resin (A) and the vinyl resin (B) preferably in the range of [urethane resin (A)/vinyl resin (B)]=90/10 to 10/90, and more preferably in the range of 70/30 to 10/90.

The resin composition for forming a receiving layer of the present invention does not simply contain the urethane resin and the vinyl polymer (B). It is important to use, as the urethane resin (A), a urethane resin having an alicyclic structure in an amount of 2,000 to 5,500 mmol/kg and a hydrophilic group.

In a resin composition for forming a receiving layer, the resin composition being obtained by using, instead of the urethane resin (A), a urethane resin having an alicyclic structure in an amount of 1,800 mmol/kg relative to the urethane resin (A), a receiving layer having excellent adhesion to various types of supports etc. may not be formed. In a resin composition for forming a receiving layer, the resin composition being obtained by using a urethane resin having an alicyclic structure in an amount of 1,800 mmol/kg, for example, in a plating process described below, the resulting receiving layer may be separated from a support by the influence of a chemical agent for plating, which is a strongly alkaline or strongly acidic substance, and thus durability may be significantly decreased.

On the other hand, in a resin composition for forming a receiving layer, the resin composition being obtained by using, instead of the urethane resin (A), a urethane resin having an alicyclic structure in an amount of 6,000 mmol/kg, similarly to the above case, a receiving layer having excellent adhesion to a support and excellent durability in the plating process may not be formed.

Accordingly, a urethane resin having an alicyclic structure in an amount of 3,000 to 5,000 mmol/kg relative to the total amount of the urethane resin (A) is preferably used as the urethane resin (A) from the standpoint of improving the adhesion, in particular, preventing the receiving layer from being separated from a support in the plating process and improving durability.

Examples of the alicyclic structure include a cyclobutyl group, a cyclopentyl group, a cyclohexyl group, a cycloheptyl group, a cyclooctyl group, a propylcyclohexyl group, a tricyclo[5.2.1.0.2.6]decyl group, a bicyclo[4.3.0]-nonyl group, a tricyclo[5.3.1.1]dodecyl group, a propyltricyclo[5.3.1.1] dodecyl group, a norbornene group, an isobornyl group, a dicyclopentanyl group, and an adamantyl group. Among these, a cyclohexyl group, a norbornene group, an isobornyl group, and an adamantyl group are preferable from the standpoint of obtaining printed matter such as a conductive pattern having excellent durability.

The alicyclic structure can be introduced into the urethane resin (A) by using an alicyclic structure-containing polyisocyanate and/or an alicyclic structure-containing polyol (a2-2) as a polyisocyanate (a1) and a polyol (a2), respectively, which are used in the production of the urethane resin (A). A urethane resin having an alicyclic structure derived from the alicyclic structure-containing polyol (a2-2) is preferably used, and a urethane resin having an alicyclic structure derived from an alicyclic structure-containing polyisocyanate and an alicyclic structure-containing polyol (a2-2) is particularly preferable from the standpoint of significantly improving adhesion of the receiving layer to various types of supports. In particular, the above-described resin composition for forming a receiving layer is preferable because durability can be improved to such a level that the resulting receiving layer is not separated from a support even in the case where the support is immersed in a chemical agent for plating, which is a strongly alkaline or strongly acidic substance, in a plating process described bellow.

From the standpoint of providing good water dispersion stability in the aqueous medium (C), it is necessary to use a urethane resin having a hydrophilic group as the urethane resin (A).

The hydrophilic group may be, for example, an anionic group, a cationic group, or a nonionic group. An anionic group is more preferably used.

Examples of the anionic group that can be used include a carboxyl group, a carboxylate group, a sulfonic acid group, and a sulfonate group. Among these, carboxylate groups or sulfonate groups, some or all of which are neutralized by a basic compound or the like are preferably used from the standpoint of providing good water dispersibility.

Examples of the basic compound that can be used for neutralizing the anionic group include ammonia; organic amines such as triethylamine, pyridine, and morpholine; alkanolamines such as monoethanolamine; and metal basic compounds containing, for example, sodium, potassium, lithium, or calcium. In the case where a conductive pattern or the like is formed, the organic amines and alkanolamines are preferably used because the metal salt compounds may degrade the electrical conduction property.

In the case where a carboxylate group or a sultanate group is used as the anionic group, the carboxylate group or the sulfonate group is present preferably in the range of 5 to 4,000 mmol/kg, and more preferably 50 to 2,000 mmol/kg relative to the total amount of the urethane resin (A) from the standpoint of maintaining good water dispersion stability of particles of the urethane resin (A).

Examples of the cationic group that can be used include tertiary amino groups.

Examples of an acid that can be used for neutralizing some or all of the tertiary amino groups include organic acids such as acetic acid, propionic acid, lactic acid, and maleic acid; organic sulfonic acids such as sulfonic acid and methanesulfonic acid; and inorganic acids such as hydrochloric acid, sulfuric acid, orthophosphoric acid, and orthophosphorous acid. These acids may be used alone or in combination of two or more acids. In the case where a conductive pattern or the like is formed, acetic acid, propionic acid, lactic acid, maleic acid, etc. are preferably used because chlorine, sulfur, etc. may degrade the electrical conduction property.

Examples of the nonionic group that can be used include polyoxyalkylene groups such as a polyoxyethylene group, a polyoxypropylene group, a polyoxybutylene group, a poly (oxyethylene-oxypropylene) group, and a polyoxyethylene-polyoxypropylene group. Among these, polyoxyalkylene groups having an oxyethylene unit are preferably used from the standpoint of further improving hydrophilicity.

The urethane resin (A) can be produced by reacting the polyisocyanate (a1), the polyol (a2), and, as required, a chain extender.

Examples of the polyisocyanate (a1) that can be used include polyisocyanates having an aromatic structure, such as 4,4'-diphenylmethane diisocyanate, 2,4'-diphenylmethane diisocyanate, carbodiimide-modified diphenylmethane diisocyanate, crude diphenylmethane diisocyanate, phenylene diisocyanate, tolylene diisocyanate, and naphthalene diisocyanate; aliphatic polyisocyanates and polyisocyanates having an alicyclic structure, such as hexamethylene diisocyanate, lysine diisocyanate, cyclohexane diisocyanate, isophorone diisocyanate, dicyclohexylmethane diisocyanate, xylylene diisocyanate, and tetramethylxylylene diisocyanate. Among these, polyisocyanates having an alicyclic structure are preferably used.

As the polyol (a2) that can react with the polyisocyanate (a1), a hydrophilic group-containing polyol (a2-1) is essentially used. If necessary, an alicyclic structure-containing polyol (a2-2) and another polyol (a2-3) may be used in combination.

Examples of the hydrophilic group-containing polyol (a2-1) that can be used include polyols having a carboxyl group, such as 2,2'-dimethylolpropionic acid, 2,2'-dimethylolbutanoic acid, 2,2'-dimethylolbutyric acid, and 2,2'-dimethylolvaleric acid; and polyols having a sulfonic acid group, such as 5-sulfoisophthalic acid, sulfoterephthalic acid, 4-sulfophthalic acid, and 5-[4-sulfophenoxy]isophthalic acid it is also possible to use, as the polyol having a hydrophilic group, for example, polyester polyols having a hydrophilic group, the polyester polyols being obtained by reacting the above low-molecular-weight polyol having a hydrophilic group with a polycarboxylic acid such as adipic acid.

The hydrophilic group is preferably present in the range of 5 to 4,000 mmol/kg, and more preferably in the range of 5 to 2,000 mmol/kg relative to the total amount of the polyol (a2) used in the production of the urethane resin (A).

From the standpoint of introducing a predetermined amount of alicyclic structure into the urethane resin (A), the alicyclic structure-containing polyol (a2-2) is preferably used as the polyol (a2).

Examples of such an alicyclic structure-containing polyol (a2-2) include alicyclic structure-containing polyols each having a relatively low molecular weight, such as 1,4-cyclohexanedimethanol, cyclobutanediol, cyclopentanediol, 1,4-cyclohexanediol, cycloheptanediol, cyclooctanediol, cyclohexanedimethanol, tricyclo[5.2.1.0.2.6]decanedimethanol, bicyclo[4.3.0]-nonanediol, dicyclohexanediol, tricyclo[5.3.1.1]dodecanediol, bicyclo[4.3.0]nonanedimethanol, tricyclo[5.3.1.1]dodecanediethanol, spiro[3.4]octanediol, butylcyclohexanediol, 1,1'-bicyclohexylidenediol, cyclohexanetriol, hydrogenated bisphenol A, and 1,3-adamantanediol. Note that the molecular weight of the alicyclic structure-containing polyol (a2-2) is based on the formula weight.

As the alicyclic structure-containing polyol (a2-2), in addition to the polyols described above, polyols obtained by reacting an alicyclic structure-containing polycarboxylic acid with an aliphatic polyol may also be used.

Examples of the alicyclic structure-containing polycarboxylic acid that can be used include 1,3-cyclopentanedicarboxylic acid, 1,2-cyclohexanedicarboxylic acid, 1,3-cyclohexanedicarboxylic acid, 1,4-cyclohexanedicarboxylic acid, anhydrides thereof, and ester-forming derivatives thereof. Among these, alicyclic structure-containing polycarboxylic acids such as 1,2-cyclohexanedicarboxylic acid and 1,4-cyclohexanedicarboxylic acid are preferably used.

Examples of the polyol that can be used in the esterification reaction with the alicyclic structure-containing polycarboxylic acid include not only 1,6-hexanediol described above but also aliphatic polyols such as ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, neopentyl glycol, 3-methyl-1,5-pentanediol, and 2-methyl-1,3-propanediol. These aliphatic polyols may be used in combination with the alicyclic structure-containing polyol (a2-2) and the polycarboxylic acid when an esterification reaction between the alicyclic structure-containing polyol (a2-2) and the polycarboxylic acid is conducted.

As the alicyclic structure-containing polyol (a2-2), for example, an alicyclic structure-containing polycarbonate polyol can be used. Examples of the alicyclic structure-containing polycarbonate polyol that can be used include polycarbonate polyols obtained by a reaction between the alicyclic structure-containing polyol (a1-1) having a low molecular weight and dimethyl carbonate, phosgene, or another compound.

An alicyclic structure-containing polycarbonate polyol having a number-average molecular weight preferably in the range of 800 to 3,000 and more preferably in the range of 800 to 2,000 is used as the alicyclic structure-containing polycarbonate polyol.

As the alicyclic structure-containing polyol (a2-2), for example, an alicyclic structure-containing polyether polyol can be used. Examples of the alicyclic structure-containing polyether polyol that can be used include polyether polyols obtained by addition polymerization of an alkylene oxide such as ethylene oxide or propylene oxide using, as an initiator, the alicyclic structure-containing polyol (a1-1) having a low molecular weight.

In addition to the polyols described above, if necessary, another polyol (a2-3) may be used as the polyol (a2).

Examples of the other polyol (a2-3) that can be used include polyester polyols, polyether polyols, polycarbonate polyols, etc. other than the polyols described above.

Examples of the polyester polyols that can be used include aliphatic polyester polyols and aromatic polyester polyols obtained by an esterification reaction between a polyol having a low molecular weight and a polycarboxylic acid; polyesters obtained by a ring-opening polymerization reaction of a cyclic ester compound such as ε-caprolactone or γ-butyrolactone; and copolymerized polyesters of these.

Examples of the polyol that has a low molecular weight and that can be used in the production of the polyester polyols include ethylene glycol, 1,2-propanediol, 1,3-butanediol, 1,4-butanediol, 1,6-hexanediol, 3-methyl-1,5-pentanediol, neopentyl glycol, diethylene glycol, dipropylene glycol, glycerol, and trimethylolpropane. These polyols may be used alone or in combination of two or more polyols. Ethylene glycol, 1,2-propanediol, 1,3-butanediol, 1,4-butanediol, etc. are preferably used in combination with 3-methyl-1,5-pentanediol, neopentyl glycol, etc.

Examples of the polycarboxylic acid that can be used include succinic acid, adipic acid, sebacic acid, dodecanedicarboxylic acid, azelaic acid, terephthalic acid, isophthalic acid, phthalic acid, naphthalene dicarboxylic acid, anhydrides thereof, and ester-forming derivatives thereof. Aliphatic polycarboxylic acids such as adipic acid are preferably used. In the case where the polyester polyols having an aromatic ring structure are used, aromatic polycarboxylic acids such as terephthalic acid, isophthalic acid, phthalic acid, and naphthalene dicarboxylic acid can be used as the polycarboxylic acid.

Examples of the polyether polyols that can be used as the other polyol (a2-3) further include polyether polyols obtained by addition polymerization of an alkylene oxide using, as an initiator, at least one compound having two or more active hydrogen atoms.

Examples of the initiator that can be used include ethylene glycol, diethylene glycol, triethylene glycol, propylene glycol, trimethylene glycol, 1,3-butanediol, 1,4-butanediol, 1,6-hexanediol, neopentyl glycol, glycerol, trimethylolethane, and trimethylolpropane.

Examples of the alkylene oxide that can be used include ethylene oxide, propylene oxide, butylene oxide, styrene oxide, epichlorohydrin, and tetrahydrofuran.

Examples of the polycarbonate polyols that can be used as the other polyol (a2-3) include polycarbonate polyols obtained by a reaction between a carbonic acid ester and a polyol, and polycarbonate polyols obtained by a reaction between phosgene and bisphenol A or another compound.

Examples of the carbonic acid ester that can be used include methyl carbonate, dimethyl carbonate, ethyl carbonate, diethyl carbonate, cyclocarbonate, and diphenyl carbonate.

Examples of the polyol that can react with the carbonic acid ester include dihydroxy compounds having a relatively low molecular weight, such as ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, 1,11-undecanediol, 1,12-dodecanediol, 3-methyl-1,5-pentanediol, 2-ethyl-1,3-hexanediol, 2-methyl-1,3-propanediol, 2-methyl-1,8-octanediol, 2-butyl-2-ethylpropanediol, 2-methyl-1,8-octanediol, neopentyl glycol, hydroquinone, resorcin, bisphenol A, bisphenol F, and 4,4'-biphenol; polyether polyols such as polyethylene glycol, polypropylene glycol, and polytetramethylene glycol; and polyester polyols such as polyhexamethylene adipate, polyhexamethylene succinate, and polycaprolactone.

As the polyester polyols, the polyether polyols, and the polycarbonate polyols, polyols having a number-average molecular weight in the range of 500 to 4,000 are preferably used from the standpoint of the ease of mixing with the matrix resin, and polyols having a number-average molecular weight in the range of 500 to 1,500 are more preferably used.

Examples of the other polyol (a2-3) include, in addition to the above polyester polyols, polyether polyols, and polycarbonate polyols, hydrophilic group-containing polyols such as ethylene glycol, 1,2-propanediol, 1,3-butanediol, 1,4-butanediol, 3-methyl-1,5-pentanediol, 1,6-hexanediol, 1,4-cyclohexanedimethanol, neopentyl glycol, diethylene glycol, dipropylene glycol, glycerol, trimethylolpropane, and dimethylol propionic acid; acrylic polyols obtained by introducing hydroxyl groups into acrylic copolymers; polybutadiene polyols which are copolymers of butadiene having a hydroxyl group in its molecule; hydrogenated polybutadiene polyols; and partially saponified products of ethylene-vinyl acetate copolymers. These polyols can be appropriately used as required.

In producing the urethane resin (A), for example, polyamines and active hydrogen atom-containing compounds can be used as the chain extender.

Examples of the polyamine that can be used include diamines such as ethylenediamine, 1,2-propanediamine, 1,6-hexamethylenediamine, piperazine, 2,5-dimethylpiperazine, isophoronediamine, 4,4'-dicyclohexylmethanediamine, 3,3'-dimethyl-4,4'-dicyclohexylmethanediamine, and 1,4-cyclohexanediamine; N-hydroxymethylaminoethylamine, N-hydroxyethylaminoethylamine, N-hydroxypropylaminopropylamine, N-ethylaminoethylamine, and N-methylaminopropylamine; diethylenetriamine, dipropylenetriamine, and triethylenetetramine; hydrazine, N,N'-dimethylhydrazine, and 1,6-hexamethylenebishydrazine; succinic acid dihydrazide, adipic acid dihydrazide, glutaric acid dihydrazide, sebacic acid dihydrazide, and isophthalic acid dihydrazide; and β-semicarbazide propionic acid hydrazide, 3-semicarbazide-propyl-carbazate, and semicarbazide-3-semicarbazidemethyl-3,5,5-trimethylcyclohexane. Among these, ethylenediamine is preferably used.

Examples of the active hydrogen atom-containing compound that can be used include glycols such as ethylene glycol, diethylene glycol, triethylene glycol, propylene glycol, 1,3-propanediol, 1,3-butanediol, 1,4-butanediol, hexamethylene glycol, saccharose, methylene glycol, glycerol, and sorbitol; phenols such as bisphenol A, 4,4'-dihydroxydiphenyl, 4,4'-dihydroxydiphenyl ether, 4,4'-dihydroxydiphenyl sulfone, hydrogenated bisphenol A, and hydroquinone; and water.

The chain extender is used so that, for example, an equivalent ratio of amino groups in a polyamine to excess isocyanate groups is preferably 1.9 or less (equivalent ratio) and more preferably in the range of 0.3 to 1.0 (equivalent ratio).

The urethane resin (A) can be produced by, for example, reacting the polyisocyanate (a1), the polyol (a2), and, as required, the chain extender to each other in the absence of a solvent or in the presence of an organic solvent by a known method.

The reaction between the polyisocyanate (a1) and the polyol (a2) is conducted at a reaction temperature of preferably 50° C. to 120° C. and more preferably 80° C. to 100° C. while sufficient care is taken with sudden heat generation, foaming, etc. in consideration of safety. The polyisocyanate (a1) and the polyol (a2) are mixed at one time or one of the polyisocyanate (a1) and the polyol (a2) is successively supplied to the other by, for example, dropping, and the reaction is conducted for about 1 to 15 hours.

An aqueous dispersion of the urethane resin (A) can be prepared as follows. The polyisocyanate (a1), the polyol (a2), and, as required, a chain extender are reacted to each other by the method described above to produce a urethane resin (A). Some or all of the hydrophilic groups such as anionic groups of the urethane resin (A) are neutralized as required, and the resulting urethane resin (A) is then mixed with an aqueous medium (C). Thus, a urethane resin (A) aqueous dispersion in which the urethane resin (A) is dispersed in the aqueous medium (C) or the urethane resin (A) is partially dissolved in the aqueous medium (C) can be obtained.

Specifically, the polyisocyanate (a1) is reacted with the polyol (a2) by the method described above to produce a urethane prepolymer (A') having an isocyanate group at an end thereof. Some or all of the hydrophilic groups such as anionic groups of the urethane prepolymer (A') are neutralized as required, and the resulting product is then mixed with an aqueous medium (C). If necessary, chain extension is conducted with the chain extender. Thus, a urethane resin (A) aqueous dispersion in which the urethane resin (A) is dispersed or dissolved in the aqueous medium (C) can be obtained.

The reaction between the polyisocyanate (a1) and the polyol (a2) is preferably conducted so that, for example, an equivalent ratio [isocyanate group [X]/hydroxyl group [Y]] of isocyanate groups [X] in the polyisocyanate (a1) to hydroxyl groups [Y] in the polyol (a2) is in the range of 0.90 to 2.0.

In producing the urethane resin (A), as described above, an organic solvent may be used as a solvent. Examples of the organic solvent include ketones such as acetone and methyl ethyl ketone; ethers such as tetrahydrofuran and dioxane; acetic acid esters such as ethyl acetate and butyl acetate; nitriles such as acetonitrile; and amides such as dimethylformamide and N-methylpyrrolidone. These organic solvents may be used alone or in combination of two or more solvents. The organic solvent is preferably removed by distillation or another method after the urethane resin (A) or the composite resin particles (D) are produced.

As the urethane resin (A) produced by the above method, a urethane resin having a weight-average molecular weight of preferably 5,000 to 500,000, and more preferably 20,000 to 100,000 is used in order to obtain, for example, printed matter having excellent adhesion and excellent printing properties and a conductive pattern having an excellent fine-line-forming property and excellent durability.

The urethane resin (A) produced by the above method may have a functional group, as required. Examples of the functional group include cross-linkable functional groups such as an alkoxysilyl group, a silanol group, a hydroxyl group, and an amino group.

The alkoxysilyl group or the silanol group can be introduced into the polyurethane (A) by using γ-aminopropyltriethoxysilane or the like in producing the urethane resin (A).

As the cross-linkable functional groups, it is possible to use functional groups that react with each other to form a cross-linked structure or that react with a cross-linking agent (E) described below to form a cross-linked structure by being heated to about 100° C. or higher and preferably 120° C. or higher.

Specifically, in the case where a urethane resin having a functional group that can undergo a cross-linking reaction by being heated to about 100° C. or higher and preferably 120° C. or higher is used, a receiving layer that is included in a receiving substrate obtained by applying a resin composition for forming a receiving layer, the resin composition containing the urethane resin, onto a surface of a support, and drying the resin composition does not substantially form a cross-linked structure. When printing is performed on this receiving substrate using the fluid and heating or the like is then performed, the receiving layer undergoes a cross-linking reaction and can form a cross-linked structure. Thus, it is possible to form printed matter, a conductive pattern, and the like which have excellent durability and in which a receiving layer is not separated from a support even when the receiving substrate is exposed to a chemical agent for plating, the chemical agent being a strongly alkaline or strongly acidic substance, in a plating process described below.

For example, in the case where a cross-linking agent such as a blocked isocyanate compound is used, the functional group that can undergo a cross-linking reaction by being heated to 100° C. or higher and preferably 120° C. or higher may be a hydroxyl group or an amino group, though the type of functional group depends on the selection of the cross-linking agent (E) used in combination.

The cross-linkable functional group is preferably contained, in total, in the range of 0.005 to 1.5 equivalent/kg relative to the total amount of the urethane resin (A).

Next, the vinyl polymer (B) used in the resin composition of the present invention for forming a receiving layer will be described.

It is important to use the vinyl polymer (B) in order to obtain printed matter such as a conductive pattern having an excellent fine-line-forming property.

A vinyl polymer having a glass transition temperature of 10° C. to 70° C. is preferably used as the vinyl polymer (B) in order to form printed matter having excellent printing properties, in particular, an excellent fine-line-forming property. Note that the glass transition temperature of the vinyl polymer (B) is a value determined by a calculation on the basis of the composition of vinyl monomers used in the production of the vinyl polymer (B). Specifically, a vinyl polymer having the above predetermined glass transition temperature can be obtained by using vinyl monomers in combination as described below.

In addition, a vinyl polymer having a glass transition temperature of 10° C. to 40° C. is preferably used from the standpoint of providing a good film-forming property of the resin composition for forming a receiving layer when the receiving layer is formed, and providing blocking resistance of such a level that adhesion with time does not occur between the receiving layer and the back surface of a support, which is included in a receiving substrate, when the receiving substrate is wound around a roll or the like or when receiving substrates are stacked.

A vinyl polymer having a weight-average molecular weight of preferably 800,000 or more, and more preferably 1,000,000 or more is used as the vinyl polymer (B) in order to form printed matter that has no bleeding and that has excellent printing properties. This also applies in order to form a receiving layer of a fluid such as a conductive ink in which bleeding does not occur and which has an excellent fine-line-forming property.

The upper limit of the weight-average molecular weight of the vinyl polymer (B) is not particularly limited, but is preferably 10,000,000 or less, and more preferably 5,000,000 or less.

The vinyl polymer (B) may have a functional group, as required. Examples of the functional group include cross-linkable functional groups such as an amide group, a hydroxyl group, a glycidyl group, an amino group, a silyl group, an aziridinyl group, an isocyanate group, an oxazoline group, a cyclopentenyl group, an allyl group, a carboxyl group, and an acetoacetyl group.

When printing is performed on the receiving substrate using a fluid such as an ink and heating or the like is then performed, the cross-linkable functional group undergoes a cross-linking reaction to form a cross-linked structure. Thus, it is possible to form printed matter such as a conductive pattern having excellent durability in which dissolution, separation, and the like of a receiving layer does not occur and a good electrical conduction property can be maintained even when, for example, a chemical agent for plating or a solvent such as a cleaning agent adheres to the receiving substrate.

It is preferable to use, as the cross-linkable functional group, a functional group that undergoes a cross-linking reaction to form the cross-linked structure by being heated to about 100° C. or higher and preferably 120° C. or higher. Specifically, at least one thermally cross-linkable functional group selected from the group consisting of a methylolamide group and alkoxymethylamide groups is preferably used.

Specific examples of the alkoxymethylamide group include amide groups formed by bonding a methoxymethyl group, an ethoxymethyl group, a propoxymethyl group, a butoxymethyl group, or the like to a nitrogen atom.

In the case where a cross-linking agent (E) described below is used, for example, a hydroxyl group or a carboxyl group is preferably used as the cross-linkable functional group. In the case where conditions for forming a receiving layer can be sufficiently controlled, an amino group may also be used.

Among the vinyl polymers described above, vinyl polymers having at least one selected from the group consisting of a methylolamide group and alkoxymethylamide groups are preferably used as the vinyl polymer (B) from the standpoint of significantly improving durability of the receiving layer and adhesion of the receiving layer to various types of supports.

Various vinyl polymers can be used as the vinyl polymer (B). For example, vinyl polymers obtained by radical polymerization of a known vinyl monomer can be used.

Examples of the vinyl monomer that can be used for producing the vinyl polymer (B) include (meth)acrylic acid esters such as methyl (meth)acrylate, ethyl (meth)acrylate, n-butyl (meth)acrylate, i-butyl (meth)acrylate, t-butyl (meth)acrylate, 2-ethylhexyl (meth)acrylate, hexyl (meth)acrylate, cyclohexyl (meth)acrylate, octyl (meth)acrylate, nonyl (meth)acrylate, dodecyl (meth)acrylate, stearyl (meth)acrylate, isobornyl (meth)acrylate, dicyclopentanyl (meth)acrylate, phenyl (meth)acrylate, and benzyl (meth)acrylate; and (meth)acrylic acid alkyl esters such as 2,2,2-trifluoroethyl (meth)acrylate, 2,2,3,3-pentafluoropropyl (meth)acrylate, perfluorocyclohexyl (meth)acrylate, 2,2,3,3-tetrafluoropropyl (meth)acrylate, and β-(perfluorooctyl)ethyl (meth)acrylate.

Among the vinyl monomers, methyl methacrylate is preferably used from the standpoint of enabling a fine line having a width of about 0.01 to 200 μm and preferably about 0.01 to 150 μm, which is required for forming a conductive pattern of an electronic circuit or the like, to be printed without causing bleeding (i.e., improving a fine-line-forming property). In addition, methyl methacrylate is preferably used from the standpoint of, for example, providing excellent adhesion between the receiving layer and the support regardless of the influence of heat etc. in a baking step or another step in the preparation of a conductive pattern.

A (meth)acrylic acid alkyl ester having an alkyl group having 2 to 12 carbon atoms is preferably used together with methyl methacrylate. An acrylic acid alkyl ester having an alkyl group having 3 to 8 carbon atoms is more preferably used, and n-butyl acrylate is still more preferably used from the standpoint of obtaining printed matter having excellent printing properties. The use of these compounds is also particularly preferable from the standpoint of forming a conductive pattern which has an excellent fine-line-forming property and does not have bleeding or the like in the case where a conductive ink is used.

Examples of the vinyl monomer that can be used in producing the vinyl polymer (B) include, in addition to the vinyl monomers described above, vinyl monomers having a carboxyl group, such as acrylic acid, methacrylic acid, β-carboxyethyl (meth)acrylate, 2-(meth)acryloyl propionic acid, crotonic acid, itaconic acid, maleic acid, fumaric acid, itaconic acid-half ester, maleic acid-half ester, maleic anhydride, itaconic anhydride, and β-(meth)acryloyl oxyethyl hydrogen succinate. The vinyl monomers having a carboxyl group may be neutralized with ammonia, potassium hydroxide, or the like.

As the other vinyl monomers, vinyl monomers having a cross-linkable functional group can be used from the standpoint of introducing, into the vinyl polymer (B), the cross-linkable functional group such as at least one amide group selected from the group consisting of a methylolamide group and alkoxymethylamide groups, an amide group other than the above amide groups, a hydroxyl group, a glycidyl group, an amino group, a silyl group, an aziridinyl group, an isocyanate group, an oxazoline group, a cyclopentenyl group, an allyl group, a carbonyl group, or an acetoacetyl group.

Examples of the vinyl monomer having at least one amide group selected from the group consisting of a methylolamide group and alkoxymethylamide groups, the vinyl monomer being capable of being used as the vinyl monomer having a cross-linkable functional group, include N-methylol(meth)acrylamide, N-methoxymethyl(meth)acrylamide, N-methoxyethoxymethyl(meth)acrylamide, N-ethoxymethyl(meth)acrylamide, N-propoxymethyl(meth)acrylamide, N-isopropoxymethyl(meth)acrylamide, N-n-butoxymethyl(meth)acrylamide, N-isobutoxymethyl(meth)acrylamide, N-pentoxymethyl(meth)acrylamide, N-ethoxymethyl-N-methoxymethyl(meth)acrylamide, N,N'-dimethylol(meth)acrylamide, N-ethoxymethyl-N-propoxymethyl(meth)acrylamide, N,N'-dipropoxymethyl(meth)acrylamide, N-butoxymethyl-N-propoxymethyl(meth)acrylamide, N,N-dibutoxymethyl(meth)acrylamide, N-butoxymethyl-N-methoxymethyl(meth)acrylamide, N,N'-dipentoxymethyl(meth)acrylamide, and N-methoxymethyl-N-pentoxymethyl(meth)acrylamide.

Among these, N-n-butoxymethyl(meth)acrylamide and N-isobutoxymethyl(meth)acrylamide are preferably used from the standpoint of obtaining printed matter having excellent printing properties and excellent durability, a conductive pattern having an excellent fine-line-forming property and excellent durability, etc.

Examples of the vinyl monomers having a cross-linkable functional group include, in addition to the vinyl monomers described above, vinyl monomers having an amide group, such as (meth)acrylamide; vinyl monomers having a hydroxyl group, such as 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, (4-hydroxymethylcyclohexyl)methyl (meth)acrylate, glycerol (meth)acrylate, polyethylene glycol (meth)acrylate, and N-hydroxyethyl(meth)acrylamide; polymerizable monomers having a glycidyl group, such as glycidyl (meth)acrylate and allylglycidyl ether (meth)acrylate; polymerizable monomers having an amino group, such as aminoethyl (meth)acrylate, dimethylaminoethyl (meth)acrylate, N-monoalkylaminoalkyl (meth)acrylate, and N,N-dialkylaminoalkyl (meth)acrylate; polymerizable monomers having a silyl group, such as vinyltrichlorosilane, vinyltrimethoxysilane, vinyltriethoxysilane, vinyltris(β-methoxyethoxy)silane, γ-(meth)acryloxypropyltrimethoxysilane, γ-(meth)acryloxypropyltriethoxysilane, γ-(meth)acryloxypropylmethyldimethoxysilane, γ-(meth)acryloxypropylmethyldiethoxysilane, γ-(meth)acryloxypropylmethyldiethoxysilane, N-β-(N-vinylbenzylaminoethyl)-γ-aminopropyltrimethoxysilane, and hydrochlorides thereof; polymerizable monomers having an aziridinyl group, such as 2-aziridinylethyl (meth)acrylate; polymerizable monomers having an isocyanate group and/or a blocked isocyanate group, such as (meth)acryloyl isocyanate and a phenol or methyl ethyl ketoxime adduct of ethyl (meth)acryloylisocyanate; polymerizable monomers having an oxazoline group, such as 2-isopropenyl-2-oxazoline and 2-vinyl-2-oxazoline; polymerizable monomers having a cyclopentenyl group, such as dicyclopentenyl (meth)acrylate; polymerizable monomers having an allyl group, such as allyl (meth)acrylate; and polymerizable monomers having a carbonyl group, such as acrolein and diacetone (meth)acrylamide.

Examples of the vinyl monomers that can be used include, in addition to the vinyl monomers described above, vinyl acetate, vinyl propionate, vinyl butyrate, vinyl versatate, methyl vinyl ether, ethyl vinyl ether, propyl vinyl ether, butyl vinyl ether, amyl vinyl ether, hexyl vinyl ether, (meth)acrylonitrile, styrene, α-methylstyrene, vinyl toluene, vinylanisole, α-halostyrene, vinyl naphthalene, divinylstyrene, isoprene, chloroprene, butadiene, ethylene, tetrafluoroethylene, vinylidene fluoride, N-vinylpyrrolidone, polyethylene glycol mono(meth)acrylate, glycerol mono(meth)acrylate, vinyl sulfonic acid, styrene sulfonic acid, allyl sulfonic acid, 2-methylallyl sulfonic acid, 2-sulfoethyl (meth)acrylate, 2-sulfopropyl (meth)acrylate, and "ADEKA REASOAP PP-70 and PPE-710" (manufactured by ADEKA Corporation) and salts thereof.

As the vinyl monomers having a cross-linkable functional group, as described above, N-butoxymethyl(meth)acrylamide and N-isobutoxymethyl(meth)acrylamide, which undergo a self-cross-linking reaction by, for example, being heated, are preferably used alone. Alternatively, N-butoxymethyl(meth)acrylamide and N-isobutoxymethyl(meth)acrylamide are preferably used in combination with (meth)acrylamide or a vinyl monomer having a hydroxyl group, such as 2-hydroxyethyl (meth)acrylate or 4-hydroxybutyl (meth)acrylate.

In the case where a cross-linking agent (E) described below is used, 2-hydroxyethyl (meth)acrylate, 2-hydroxypropyl (meth)acrylate, and 4-hydroxybutyl (meth)acrylate are more preferably used from the standpoint of introducing a functional group, e.g., a hydroxyl group, which can serve as a cross-linking point with the cross-linking agent (E). The use of the vinyl monomers having a hydroxyl group is preferable in the case where an isocyanate cross-linking agent is used as the cross-linking agent (E) described below.

The vinyl monomer having a cross-linkable functional group can be used in the range of 0% to 50% by mass relative to the total amount of the vinyl monomer mixture. In the case where the cross-linking agent (E) undergoes a self-cross-linking reaction or in the case where the cross-linking agent (E) reacts with a cross-linkable functional group that can be contained in the urethane resin (A), the vinyl monomer having a cross-linkable functional group may not be used.

Among the vinyl monomers having a cross-linkable functional group, the vinyl monomer having an amide group is preferably used in the range of 0.1% to 50% by mass, and more preferably in the range of 1% to 30% by mass relative to the total amount of the vinyl monomer mixture from the standpoint of introducing a self-cross-linking reactive methylolamide group or the like. Another vinyl monomer having an amide group used in combination with the self-cross-linking reactive methylolamide group and the vinyl monomer having a hydroxyl group are preferably used in the range of 0.1% to 30% by mass, and more preferably in the range of 1% to 20% by mass relative to the total amount of the vinyl monomers.

Among the vinyl monomers having a cross-linkable functional group, the vinyl monomer having a hydroxyl group is used preferably in the range of about 0.05% to 50% by mass, more preferably about 0.05% to 30% by mass, and still more preferably about 0.1% to 10% by mass relative to the total amount of the vinyl monomer mixture, though the amount depends on, for example, the type of cross-linking agent (E) that is used in combination.

The (meth)acrylic acid alkyl esters is preferably used in the range of 30% to 95% by mass relative to the total amount of the vinyl monomer mixture used in the production of the vinyl polymer (B). In particular, methyl (meth)acrylate is preferably used in the range of 10% to 70% by mass, and more preferably 30% to 65% by mass relative to the total amount of the vinyl monomer mixture. In addition, an acrylic acid alkyl ester having an alkyl group having 2 to 12 carbon atoms, and preferably an acrylic acid alkyl ester having an alkyl group having 3 to 8 carbon atoms, and more preferably butyl (meth)acrylate is used in the range of 10% to 50% by mass.

The vinyl polymer (B) can be produced by polymerizing a mixture of the vinyl monomers described above by a known method. An emulsion polymerization method is preferably employed as means for obtaining a high-molecular-weight polymer that can form a receiving layer capable of forming printed matter that does not have bleeding and that has excellent printing properties and an excellent fine-line-forming property.

Examples of the emulsion polymerization method that can be used include a method in which water, a vinyl monomer mixture, a polymerization initiator, and as required, a chain transfer agent, an emulsifier, a dispersion stabilizer, etc. are supplied in a reaction vessel at one time, mixed, and polymerized; a monomer-dropping method in which a vinyl monomer mixture is added dropwise into a reaction vessel and polymerized; and a pre-emulsion method in which a mixture prepared by mixing a vinyl monomer mixture, an emulsifier or the like, and water in advance is added dropwise into a reaction vessel and polymerized.

The temperature in the emulsion polymerization is preferably, for example, about 30° C. to 90° C., though it depends on the types of vinyl monomers and polymerization initiator used. The polymerization time is preferably, for example, about 1 to 10 hours.

Examples of the polymerization initiator include persulfates such as potassium persulfate, sodium persulfate, and ammonium persulfate; organic peroxides such as benzoyl peroxide, cumene hydroperoxide, and t-butyl hydroperoxide; and hydrogen peroxide. The polymerization can be conducted by radical polymerization using any of these peroxides alone; by using a redox polymerization initiator in which the above peroxide is used in combination with a reducing agent such as ascorbic acid, erythorbic acid, sodium erythorbate, a metal salt of formaldehyde sulfoxylate, sodium thiosulfate, sodium bisulfite, or ferric chloride; or by using an azo-based initiator such as 4,4'-azobis(4-cyanovaleric acid) and 2,2'-azobis(2-amidinopropane) dihydrochloride. These compounds may be used alone or in combination of two or more compounds.

Examples of the emulsifier that can be used for producing the vinyl polymer (B) include anionic surfactants, nonionic surfactants, cationic surfactants, and amphoteric surfactants.

Examples of the anionic surfactant include sulfuric acid esters of higher alcohols and salts thereof, alkylbenzenesulfonic acid salts, polyoxyethylene alkyl phenyl sulfonic acid salts, polyoxyethylene alkyl diphenyl ether sulfonic acid salts, sulfuric acid half ester salts of polyoxyethylene alkyl ethers, alkyl diphenyl ether disulfonic acid salts, and succinic acid dialkyl ester sulfonic acid salts. Examples of the nonionic surfactant that can be used include polyoxyethylene alkyl ethers, polyoxyethylene alkyl phenyl ethers, polyoxyethylene diphenyl ether, polyoxyethylene-polyoxypropylene block copolymers, and acetylenediol-based surfactants.

Examples of the cationic surfactant that can be used include an alkyl ammonium salts.

Examples of the amphoteric surfactant that can be used include alkyl (amide) betaines and alkyldimethylamine oxides.

Examples of the emulsifier that can be used include, in addition to the above surfactants, fluorine-based surfactants, silicone-based surfactants, and emulsifiers that are generally referred to as "reactive emulsifiers", each of which has a polymerizable unsaturated group in its molecule.

Examples of the reactive emulsifier that can be used include "LATEMUL S-180" (manufactured by Kao Corporation), "ELEMINOL JS-2" and "ELEMINOL RS-30" (manufactured by Sanyo Chemical Industries, Ltd.), all of which have a sulfonic acid group and a salt thereof; "Aquaron HS-10", "Aquaron HS-20", and "Aquaron KH-1025" (manufactured by Dai-ichi Kogyo Seiyaku Co., Ltd.), "ADEKA REASOAP SE-10" and "ADEKA REASOAP SE-20" (manufactured by ADEKA Corporation), all of which have a sulfate group and a salt thereof; "New Frontier A-229E" (manufactured by Dai-ichi Kogyo Seiyaku Co., Ltd.), which has a phosphate group; and "Aquaron RN-10", "Aquaron RN-20", "Aquaron RN-30", and "Aquaron RN-50" (manufactured by Dai-ichi Kogyo Seiyaku Co., Ltd.), all of which have a nonionic hydrophilic group.

As an aqueous medium used in the production of the vinyl polymer (B), the same as those exemplified as an aqueous medium (C) described below can be used.

An example of the chain transfer agent that can be used in the production of the vinyl polymer (B) is lauryl mercaptan. The chain transfer agent is preferably used in the range of 0 to 1.0% by mass, and more preferably in the range of 0% to 0.5% by mass relative to the total amount of the vinyl monomer mixture.

A resin composition for forming a receiving layer, the resin composition independently containing the urethane resin (A) and the vinyl polymer (B) in the aqueous medium (C), can be produced by mixing an aqueous dispersion of the urethane resin (A) obtained above with an aqueous dispersion of the vinyl polymer (B).

A resin composition for forming a receiving layer, the resin composition containing composite resin particles (D) formed by the urethane resin (A) and the vinyl polymer (B), can be produced by, for example, the method described below.

As described above, the composite resin particles (D) can be produced by, for example, a step (W) of reacting the polyisocyanate (a1), the polyol (a2), and, as required, a chain extender to each other and dispersing the resulting product in water to produce an aqueous dispersion of a urethane resin (A), and a step (Y) of polymerizing the vinyl monomer in the aqueous dispersion to produce a vinyl polymer (B).

Specifically, the polyisocyanate (a1) and the polyol (a2) are reacted to each other in the absence of a solvent, in the presence of an organic solvent, or in the presence of a reactive diluent such as a vinyl monomer to obtain a urethane resin (A). Subsequently, some or all of hydrophilic groups in the urethane resin (A) are neutralized using, for example, a basic compound, as required. If necessary, the resulting product is further reacted with a chain extender, and the resulting urethane resin (A) is dispersed in an aqueous medium (D). Thus, an aqueous dispersion of the urethane resin (A) is produced.

Subsequently, the vinyl monomer is supplied to the aqueous dispersion of the urethane resin (A) prepared above, and the vinyl monomer is radically polymerized in the particles of the urethane resin (A) to produce a vinyl polymer (B).

Consequently, it is possible to produce a resin composition for forming a receiving layer, the resin composition containing composite resin particles (D) in which the vinyl polymer (B) is present in the particles of the urethane resin (A), the composite resin particles (D) being dispersed in the aqueous medium (C).

In producing the composite resin particles (D), in the case where the urethane resin (A) has a high viscosity and thus workability is poor, a common organic solvent such as methyl ethyl ketone, N-methylpyrrolidone, acetone, or dipropylene glycol dimethyl ether, or a reactive diluent may be used. In particular, for example, a vinyl monomer that can be used for producing the vinyl polymer (B) is preferably used as the reactive diluent from the standpoint of improving the production efficiency of the resin composition for forming a receiving layer by omitting a step of removing a solvent.

Examples of the aqueous medium (C) in which the urethane resin (A) and the vinyl polymer (B) that are prepared by, for example, the above reactions or the composite resin particles (D) can be dispersed or dissolved include water, organic solvents miscible with water, and mixtures thereof. Examples of the organic solvent miscible with water include alcohols such as methanol, n-propyl alcohol, and iso-propyl alcohol; ketones such as acetone and methyl ethyl ketone; polyalkylene glycols such as ethylene glycol, diethylene glycol, and propylene glycol; alkyl ethers of polyalkylene glycols; and lactams such as N-methyl-2-pyrrolidone. In the present invention, only water may be used, a mixture of water and an organic solvent miscible with water may be used, or only an organic solvent miscible with water may be used. From the standpoint of safety and the load on the environment, only water or a mixture of water and an organic solvent miscible with water is preferable. Only water is particularly preferable.

The aqueous medium (C) is contained in an amount of preferably 50% to 90% by mass, and more preferably 65% to 85% by mass relative to the total amount of the resin composition for forming a receiving layer.

In the resin composition of the present invention for forming a receiving layer, a water-soluble resin may be used in combination, in particular, in order to further improve printing properties and a fine-line-forming property in the case where a fluid such as a water-based pigment ink, conductive ink, or plating nucleus agent is used.

Examples of the water-soluble resin that can be used include polyvinyl alcohol, polyvinylpyrrolidone, polyvinylacetal, polyalkylene oxides, starch, cellulose derivatives such as methyl cellulose, hydroxyl cellulose, hydroxypropyl cellulose, hydroxypropyl methylcellulose, and carboxymethyl cellulose, polyethyleneimine, polyamides, quaternary ammonium salt-containing water-soluble resins, and modified products thereof. Among these, polyvinyl alcohol is preferably used.

In the resin composition of the present invention for forming a receiving layer, if necessary, in addition to the cross-linking agent (E), known additives such as a pH adjusting agent, a coating film-forming auxiliary agent, a leveling agent, a thickener, a water-repellent agent, and an antifoaming agent may be added and used within a range that does not impair the effects of the present invention.

Examples of the cross-linking agent (E) that can be used include a thermal cross-linking agent (e1-1) that reacts at a relatively low temperature of about 25° C. or higher and lower than 100° C. and that can form a cross-linked structure, such as metal chelate compounds, polyamine compounds, aziridine compounds, metal salt compounds, and isocyanate compounds; a thermal cross-linking agent (e1-2) that reacts at a relatively high temperature of about 100° C. or higher and that can form a cross-linked structure, such as at least one selected from the group consisting of melamine compounds, epoxy compounds, oxazoline compounds, carbodiimide compounds, and blocked isocyanate compounds; and photo-cross-linking agents.

In the case where a resin composition for forming a receiving layer contains the thermal cross-linking agent (e1-1), for example, the resin composition is applied onto a surface of a support and dried at a relatively low temperature, printing is then conducted using the fluid, and the resulting support is then heated to a temperature of lower than 100° C. to form a cross-linked structure. Thus, it is possible to form an ink-receiving substrate having excellent durability of such a level that detachment of a conductive substance, a pigment, or the like can be prevented regardless of the influence of heat or an external force for a long time.

On the other hand, in the case where a resin composition for forming a receiving layer contains the thermal cross-linking agent (e1-2), for example, the resin composition is applied onto a surface of a support and dried at a low temperature in the range of room temperature (25° C.) to lower than about 100° C. to produce an ink-receiving substrate in which a cross-linked structure is not formed, printing is then conducted using an ink or the like, and the resulting ink-receiving substrate is then heated to a temperature of 100° C. or higher, and preferably 120° C. or higher to form a cross-linked structure. Thus, it is possible to form printed matter or a conductive pattern having excellent durability of such a level that separation of the ink or the like does not occur regardless of the influence of heat, an external force, or the like for a long time.

Examples of the metal chelate compound that can be used as the thermal cross-linking agent (e1-1) include acetylacetone coordination compounds and acetoacetic ester coordination compounds of a polyvalent metal such as aluminum, iron, copper, zinc, tin, titanium, nickel, antimony, magnesium, vanadium, chromium, or zirconium. Acetylacetone aluminum, which is an acetylacetone coordination compound of aluminum, is preferably used.

Examples of the polyamine compound that can be used as the thermal cross-linking agent (e1-1) include tertiary amines such as triethylamine, triethylenediamine, and dimethylethanolamine.

Examples of the aziridine compound that can be used as the thermal cross-linking agent (e1-1) include 2,2-bishydroxymethylbutanol-tris[3-(1-aziridinyl)propionate], 1,6-hexamethylenediethyleneurea, and diphenylmethane-bis-4,4'-N,N'-diethyleneurea.

Examples of the metal salt compound that can be used as the thermal cross-linking agent (e1-1) include aluminum-containing compounds such as aluminum sulfate, aluminum alum, aluminum sulfite, aluminum thiosulfate, polyaluminum chloride, aluminum nitrate nonahydrate, and aluminum chloride hexahydrate; and water-soluble metal salts such as titanium tetrachloride, tetraisopropyl titanate, titanium acetylacetonate, and lactic acid titanium.

Examples of the isocyanate compound that can be used as the thermal cross-linking agent (e1-1) include polyisocyanates such as tolylene diisocyanate, hydrogenated tolylene diisocyanate, triphenylmethane triisocyanate, methylenebis (4-phenylmethane) triisocyanate, isophorone diisocyanate, hexamethylene diisocyanate, and xylylene diisocyanate; isocyanurate-type polyisocyanate compounds obtained using any of these polyisocyanate compounds; adducts composed of any of these polyisocyanate compounds and trimethylolpropane or the like; and polyisocyanate group-containing urethanes obtained by reacting any of these polyisocyanate compounds with a polyol such as trimethylolpropane. Among these, an isocyanurate of hexamethylene diisocyanate, an adduct of hexamethylene diisocyanate and trimethylolpropane or the like, an adduct of tolylene diisocyanate and trimethylolpropane or the like, or an adduct of xylylene diisocyanate and trimethylolpropane or the like is preferably used.

Examples of the melamine compound that can be used as the thermal cross-linking agent (e1-2) include hexamethoxymethylmelamine, hexaethoxymethylmelamine, hexapropoxymethylmelamine, hexabutoxymethylmelamine, hexapentyloxymethylmelamine, hexahexyloxymethylmelamine, and mixed etherified melamines obtained by using two of these melamine compounds in combination. In particular, trimethoxymethylmelamine or hexamethoxymethylmelamine is preferably used. Examples of a commercially available product that can be used include Beckamine M-3, APM, and J-101 (manufactured by DIC Corporation). The melamine compounds can form a cross-linked structure by a self-cross-linking reaction.

In the case where the melamine compounds are used, a catalyst such as an organic amine salt may be used in order to accelerate the self-cross-linking reaction. Examples of a commercially available product that can be used include Catalyst ACX, 376, etc. The amount of the catalyst is preferably about 0.01% to 10% by mass relative to the total amount of the melamine compound.

Examples of the epoxy compound that can be used as the thermal cross-linking agent (e1-2) include polyglycidyl ethers of aliphatic polyhydric alcohols such as ethylene glycol diglycidyl ether, propylene glycol diglycidyl ether, hexamethylene glycol diglycidyl ether, cyclohexanediol diglycidyl ether, glycerin diglycidyl ether, glycerin triglycidyl ether, trimethylolpropane triglycidyl ether, and pentaerythritol tetraglycidyl ether; polyglycidyl ethers of polyalkylene glycols such as polyethylene glycol diglycidyl ether, polypropylene glycol diglycidyl ether, and polytetramethylene glycol diglycidyl ether; polyglycidylamines such as 1,3-bis(N,N'-diglycidylaminoethyl)cyclohexane; polyglycidyl esters of polyvalent carboxylic acids [such as oxalic acid, adipic acid, butanetricarboxylic acid, maleic acid, phthalic acid, terephthalic acid, isophthalic acid, or benzene tricarboxylic acid]; bisphenol A-based epoxy resins such as a condensate of bisphenol A and epichlorohydrin and an ethylene oxide adduct of a condensate of bisphenol A and epichlorohydrin; phenol novolak resins; and vinyl (co)polymers having an epoxy group in a side chain thereof. Among these, a polyglycidylamine, such as 1,3-bis(N,N'-diglycidylaminoethyl) cyclohexane, and a polyglycidyl ether of an aliphatic polyhydric alcohol, such as glycerin diglycidyl ether, are preferably used.

Examples of the epoxy compound that can be used include, in addition to the compounds described above, glycidyl group-containing silane compounds such as γ-glycidoxypropyltrimethoxysilane, γ-glycidoxypropyltriethoxysilane, γ-glycidoxypropylmethyldimethoxysilane, γ-glycidoxypropylmethyldiethoxysilane, β-(3,4-epoxycyclohexyl)ethyltrimethoxysilane, β-(3,4-epoxycyclohexyl)ethyltriethoxysilane, β-(3,4-epoxycyclohexyl)ethylmethyldiethoxysilane, and γ-glycidoxypropyltriisopropenyloxysilane.

Examples of the oxazoline compound that can be used as the thermal cross-linking agent (e1-2) include 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline) bis-(2-oxazolinylcyclohexane)sulfide, and bis-(2-oxazolinylnorbornane)sulfide.

Examples of the oxazoline compound that can be used further include oxazoline group-containing polymers obtained by polymerizing an addition-polymerizable oxazoline described below and, as required, in combination with another monomer.

Examples of the addition-polymerizable oxazoline include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline, and 2-isopropenyl-5-ethyl-2-oxazoline. These may be used alone or in combination of two or more compounds. Among these, 2-isopropenyl-2-oxazoline is preferably used because it is industrially easily available.

Examples of the carbodiimide compound that can be used as the thermal cross-linking agent (e1-2) include poly[phenylenebis(dimethylmethylene)carbodiimide] and poly (methyl-1,3-phenylenecarbodiimide). As commercially available products, for example, Carbodilite V-01, V-02, V-03, V-04, V-05, and V-06 (manufactured by Nisshinbo Chemical Inc.) and UCARLINK XL-29SE and XL-29MP (manufactured by Union Carbide Corporation) can be used.

Examples of the blocked isocyanate compound that can be used as the thermal cross-linking agent (e1-2) include compounds in which some or all of isocyanate groups in the isocyanate compounds exemplified as the thermal cross-linking agent (e1-1) are blocked by a blocking agent.

Examples of the blocking agent that can be used include phenol, cresol, 2-hydroxypyridine, butyl cellosolve, propylene glycol monomethyl ether, benzyl alcohol, methanol, ethanol, n-butanol, isobutanol, dimethyl malonate, diethyl malonate, methyl acetoacetate, ethyl acetoacetate, acetylacetone, butyl mercaptan, dodecyl mercaptan, acetanilide, acetic acid amide, ε-caprolactam, δ-valerolactam, γ-butyrolactam, succinimide, maleic acid imide, imidazole, 2-methylimidazole, urea, thiourea, ethylene urea, formamide oxime, acetaldoxime, acetone oxime, methyl ethyl ketone oxime, methyl isobutyl ketone oxime, cyclohexanone oxime, diphenylaniline, aniline, carbazole, ethyleneimine, and polyethyleneimine.

As the blocked isocyanate compound, for example, Elastron BN-69 (manufactured by Dai-ichi Kogyo Seiyaku Co., Ltd.) can be used as a water-dispersion type commercially available product.

In the case where the cross-linking agent (E) is used, a vinyl resin having a group that can react with the cross-linkable functional group in the cross-linking agent (E) is preferably used as the vinyl resin (B). Specifically, the (blocked) isocyanate compounds, melamine compounds, oxazoline compounds, and carbodiimide compounds are used as the cross-linking agent, and a vinyl resin having a hydroxyl group or a carboxyl group is preferably used as the vinyl resin (A).

In general, the cross-linking agent (E) is preferably used in the range of 0.01% to 60% by mass, more preferably 0.1% to 10% by mass, and still more preferably 0.1% to 5% by mass relative to 100 parts by mass of the total mass of the urethane resin (A), the vinyl polymer (B), and the composite resin particles (D) from the standpoint of forming a receiving layer on which a printed image having further improved printing properties can be formed, though the amount of cross-linking agent (E) varies depending on, for example, the type of cross-linking agent (E). Furthermore, the cross-linking agent (E) is preferably used in the above ranges for the following reason: In the case where a conductive pattern is formed using a conductive ink or the like, it is possible to provide a further improved fine-line-forming property of such a level that an increase in integration density of electronic circuits or the like is realized without causing bleeding of a printed portion such as a fine line, and to further improve the adhesion between the receiving layer and a support.

The cross-linking agent (E) is preferably added in advance to the resin composition of the present invention for forming a receiving layer before the resin composition is applied onto or impregnated into a surface of a support.

The resin composition of the present invention for forming a receiving layer may contain, in addition to the additives described above, solvent-soluble or solvent-dispersible thermosetting resins such as a phenolic resin, a urea resin, a melamine resin, a polyester resin, a polyamide resin, and a urethane resin.

Various types of fillers such as inorganic particles may also be used as the additive. However, in the resin composition of the present invention for forming a receiving layer, the amount of filler used is preferably as small as possible, and more preferably, 5% by mass or less relative to the total amount of the resin composition of the present invention for forming a receiving layer.

The amount of additive used is not particularly limited as long as the effects of the present invention are not impaired, but is preferably in the range of 0.01% to 40% by mass relative to the total solid content in the resin composition for forming a conductive receiving layer.

A receiving layer that can be formed by using the resin composition for forming a receiving layer is a swelling-type receiving layer in which the urethane resin (A), the vinyl polymer (B), and the composite resin particles (D) that form the receiving layer are appropriately dissolved in a solvent contained in a fluid such as an ink and absorb the solvent, and thus a pigment or a conductive substance such as a metal that is contained in the fluid can be fixed to a surface of the ink-receiving layer with a high accuracy. Accordingly, bleeding-free printed matter such as a conductive pattern can be obtained. Furthermore, the resin composition of the present invention for forming a receiving layer can form a transparent receiving layer, as compared with a known porous-type receiving layer.

Next, a receiving substrate of the present invention, the receiving substrate being used for receiving the fluid, will be described.

The receiving substrate of the present invention includes a support and a receiving layer formed on part of or the entire surface of the support and on a surface or both surfaces of the support using the resin composition for forming a receiving layer.

The receiving layer is a layer that absorbs a solvent in the fluid and carries a conductive substance or a pigment on a surface of the receiving layer when the fluid contacts the surface of the receiving layer. For example, in the case where a pigment ink is used as the fluid, a highly sharp printed matter without bleeding or the like can be formed. In the case where a conductive ink is used as the fluid, a conductive pattern without bleeding or the like can be formed. In the case where a plating nucleus agent is used as the fluid, it is possible to form a laminate in which plating nuclei are uniformly carried on a surface of the receiving layer without unevenness.

The receiving layer may be stacked on the support. Alternatively, part of the receiving layer may be impregnated into the support.

The receiving substrate of the present invention can be produced by applying the receiving substrate onto either one surface or both surfaces of a support or by impregnating the receiving substrate into a support when the support is a fibrous base or the like, and then volatilizing the aqueous medium (C) contained in the resin composition for forming a receiving layer.

Examples of the support that can be used include not only wood-free paper and coated paper but also supports composed of a polyimide resin, a polyamide-imide resin, a polyamide resin, polyethylene terephthalate, polyethylene naphthalate, polycarbonate, acrylonitrile-butadiene-styrene (ABS), an acrylic resin such as polymethyl (meth)acrylate, polyvinylidene fluoride, polyvinyl chloride, polyvinylidene chloride, polyvinyl alcohol, polyethylene, polypropylene, polyurethane, cellulose nanofibers, silicon, a ceramic, or glass; porous supports composed of any of these; and supports composed of a metal such as copper or a steel sheet.

Examples of the support that can be used further include bases composed of synthetic fibers such as polyester fibers, polyamide fibers, or aramid fibers; and bases composed of natural fibers such as cotton or hemp. These fibers may be processed in advance.

Known methods can be employed as a method for applying the resin composition for forming a receiving layer onto the support or impregnating the support with the resin composition. Examples of the method include a gravure method, a coating method, a screen method, a roller method, a rotary method, and a spray method.

A method for volatilizing the aqueous medium (C) contained in a receiving layer after the resin composition of the present invention for forming the receiving layer is applied onto or impregnated into a support is not particularly limited, but a drying method using a dryer is common. The drying temperature may be set to a temperature in a range in which the aqueous medium (C) can be volatilized and the support is not adversely affected.

A method for removing a solvent such as a solvent that may be contained in the resin composition of the present invention for forming a receiving layer after the resin composition is applied onto or impregnated into part of or the entire surface of a support is not particularly limited, but a drying method using a dryer is common. The drying temperature may be set to a temperature in a range in which the solvent can be volatilized and the support is not adversely affected. Specifically, in the case where the thermal cross-linking agent (e1-1) is used, drying is preferably performed at a temperature of about 25° C. or higher and lower than 100° C. In the case where the thermal cross-linking agent (e1-2) is used, drying is preferably performed at a temperature of about 100° C. or higher, more preferably at a temperature in the range of about 120° C. to 300° C. On the other hand, in the case where the thermal cross-linking agent (e1-2) is used, and printing is performed with a fluid such as an ink and a cross-linked structure is then formed, it is preferable to perform drying at a relatively low temperature of about room temperature (25° C.) to 100° C. so that a cross-linked structure is not formed before the printing.

The amount of the resin composition for forming a receiving layer, the resin composition adhering to the support, is preferably in the range of 3 to 60 g/m$^2$ with respect to the area of the support from the standpoint of maintaining a very high level of color-developing property and maintaining a good production efficiency, and particularly preferably in the range of 20 to 40 g/m$^2$ considering a property of absorbing a solvent contained in a fluid and the production cost.

By increasing the amount of the resin composition for forming a receiving layer, the resin composition adhering to the support, the color-developing property of the resulting printed matter can be further improved. However, an increase in the amount of the resin composition tends to make the texture of the resulting printed matter somewhat hard. Accordingly, it is preferable to appropriately adjust the amount of the resin composition in accordance with, for example, the use of the printed matter.

A printed image having excellent printing properties and water resistance can be formed on the receiving substrate of the present invention without causing bleeding or cracks. Thus, the receiving substrate of the present invention can be used in, for example, indoor and outdoor advertisements such as a signboard, advertisement on vehicles, and a banner.

The fluid that can be used for printing on the receiving substrate is a liquid or a viscous liquid having a viscosity of 0.1 to 500,000 mPa·s and preferably 0.5 to 10,000 mPa·s measured at about 25° C. with a B-type viscometer, and contains a solvent and a conductive substance, a pigment, or the like that is dispersed in the solvent. For example, in the case where the fluid is printed by an ink-jet printing method, a fluid having a viscosity in the range of 0.5 to 10,000 mPa·s is preferably used.

Specific examples of the fluid include printing inks such as a conductive ink and a pigment ink, and a plating nucleus agent that may be used in a plating process.

An example of the fluid is a water-based pigment ink in which, for example, a pigment is dispersed in an aqueous medium.

As the aqueous medium, only water may be used or a mixed solution of water and a water-soluble solvent may be used. Examples of the water-soluble solvent that can be used include alcohols such as methyl alcohol, ethyl alcohol, isopropyl alcohol, ethyl carbitol, ethyl cellosolve, and butyl cellosolve; and polar solvents such as N-methylpyrrolidone.

Examples of the pigment that can be dispersed or dissolved in the aqueous medium include organic pigments such as quinacridone-based pigments, anthraquinone-based pigments, perylene-based pigments, perinone-based pigments, diketopyrrolopyrrole-based pigments, isoindolinone-based pigments, condensed azo-based pigments, benzimidazolone-based pigments, monoazo-based pigments, insoluble azo-based pigments, naphthol-based pigments, flavanthrone-based pigments, anthrapyrimidine-based pigments, quinophthalone-based pigments, pyranthrone-based pigments, pyrazolone-based pigments, thioindigo-based pigments, anthanthrone-based pigments, dioxazine-based pigments, phthalocyanine-based pigments, and indanthrone-based pigments; metal complexes such as nickel dioxin yellow and copper azomethine yellow; metal oxides such as titanium oxide, iron oxide, and zinc oxide; metal salts such as barium sulfate and calcium carbonate; inorganic pigments such as carbon black and mica; fine powders of a metal such as aluminum; and fine powders of mica. The pigment is preferably used in the range of 0.5% to 15% by mass, and more preferably 1% to 10% by mass relative to the total amount of water-based pigment ink.

A solvent-based pigment ink in which a pigment etc. are dissolved or dispersed in a solvent composed of an organic solvent may also be used as the fluid.

As the organic solvent, alcohols, ethers, esters, ketones, etc. which have a boiling point of 100° C. to 250° C. are preferably used, and those having a boiling point of 120° C. to 220° C. are more preferably used from the standpoint of, for example, preventing the drying and clogging of an ink jet head.

Examples of the alcohols that can be used include ethylene glycol, triethylene glycol, tetraethylene glycol, propylene glycol, and dipropylene glycol.

Examples of the ethers that can be used include ethylene glycol mono(methyl, ethyl, butyl, phenyl, benzyl, and ethylhexyl)ethers, ethylene glycol di(methyl, ethyl, and butyl) ethers, diethylene glycol mono(methyl, ethyl, and butyl) ethers, diethylene glycol di(methyl, ethyl, butyl)ethers, tetraethylene glycol mono(methyl, ethyl, and butyl)ethers, tetraethylene glycol di(methyl, ethyl, and butyl)ethers, propylene glycol mono(methyl, ethyl, and butyl)ethers, dipropylene glycol mono(methyl and ethyl)ethers, and tripropylene glycol monomethyl ether.

Examples of the esters include ethylene glycol mono(methyl, ethyl, and butyl)ether acetates, ethylene glycol di(methyl, ethyl, and butyl)ether acetates, diethylene glycol mono (methyl, ethyl, and butyl)ether acetates, diethylene glycol di(methyl, ethyl, and butyl)ether acetates, propylene glycol mono(methyl, ethyl, and butyl)ether acetates, dipropylene glycol mono(methyl and ethyl)ether acetates, tripropylene glycol monomethyl ether acetate, 2-(methoxy, ethoxy, and butoxy)ethyl acetates, 2-ethylhexyl acetate, dimethyl phthalate, diethyl phthalate, and butyl lactate. Examples of the ketones include cyclohexanone.

Among these organic solvents, diethylene glycol diethyl ether, tetraethylene glycol monobutyl ether, tetraethylene glycol dimethyl ether, ethylene glycol monobutyl ether acetate, and propylene glycol monomethyl ether acetate are preferably used.

As the pigment used in the solvent-based pigment ink, the same as those exemplified as the pigments that can be used in the water-based pigment ink can be used.

The receiving substrate of the present invention can be particularly suitably used in the case where printing is performed with a solvent-based pigment ink among pigment inks such as the water-based pigment inks and the solvent-based pigment inks.

Various printing methods can be employed as a method for performing printing on a receiving substrate of the present invention with the pigment ink. An ink-jet printing method, a screen printing method, a letterpress reverse printing method, or a gravure off-set printing method is preferably employed.

The receiving substrate of the present invention also has excellent printing properties for a conductive ink containing a conductive substance, the conductive ink serving as the fluid. For example, a fine line having a width of about 0.01 to 200 μm and preferably about 0.01 to 150 μm, which is required for forming a conductive pattern of an electronic circuit or the like, can be printed without causing bleeding (fine-line-forming property). Accordingly, the receiving substrate of the present invention can be suitably used in, for example, the printed electronics field, such as the formation of an electronic circuit using a silver ink or the like, the formation of layers and peripheral wiring that are included in an organic solar cell, an electronic book terminal, an organic EL device, an organic transistor, a flexible printed circuit board, RFID, etc., and the formation of wiring of an electromagnetic wave shield of a plasma display.

The receiving substrate (conductive-ink-receiving substrate) of the present invention that can be used for forming the conductive pattern includes a support and a receiving layer disposed on part of or an entire surface of the support, the receiving layer being formed using the resin composition for forming a receiving layer, as in the receiving substrate described above. The receiving layer may be stacked on the support. Alternatively, part of the receiving layer may be impregnated into the support. The receiving layer may be provided on either one surface or both surfaces of the support, and may be applied onto part or the entirety of the one or two surfaces.

The receiving substrate of the present invention can be produced by applying the resin composition for forming a receiving layer onto part or the entirety of one surface or both surfaces of a support or by impregnating the resin composition into part of or the entirety of one or two surfaces of a support, and then removing the aqueous medium (C) contained in the resin composition for forming a conductive receiving layer.

In producing the conductive pattern, examples of the support suitable for stacking the receiving layer thereon include supports composed of a polyimide resin, a polyamide-imide resin, a polyamide resin, polyethylene terephthalate, polyethylene naphthalate, polycarbonate, acrylonitrile-butadiene-styrene (ABS), an acrylic resin such as polymethyl (meth) acrylate, polyvinylidene fluoride, polyvinyl chloride, polyvinylidene chloride, polyvinyl alcohol, polycarbonate, polyethylene, polypropylene, polyurethane, cellulose nanofibers, silicon, a ceramic, or glass; porous supports composed of any of these; and supports composed of a metal such as copper or a steel sheet.

Among these, supports composed of a polyimide resin, polyethylene terephthalate, polyethylene naphthalate, glass, cellulose nanofibers, or the like, all of which are often used as a support when a conductive pattern of a circuit board or the like is formed, are preferably used as the support.

Among the above supports, bases composed of a polyimide resin, polyethylene terephthalate, polyethylene naphthalate, polycarbonate, acrylonitrile-butadiene-styrene (ABS), an acrylic resin, glass, or the like generally have low adhesiveness, and thus a resin or another material often does not readily adhere to the supports.

In the case where the support is used in, for example, an application that requires flexibility, a support that is relatively flexible and that can be bent is preferably used from the standpoint of providing flexibility to a conductive pattern and obtaining a final product that can be bent. Specifically, for example, a uniaxially stretched film-like or sheet-like support is preferably used.

Examples of the film-like or sheet-like support include a polyethylene terephthalate film, a polyimide film, and a polyethylene naphthalate film.

Known methods can be employed as a method for applying the resin composition for forming a receiving layer onto part or the entire surface of the support or impregnating part or the entire surface of the support with the resin composition. Examples of the method include a gravure method, a coating method, a screen method, a roller method, a rotary method, a spray method, and an ink-jet method.

A method for removing the aqueous medium (C) that may be contained in the resin composition of the present invention for forming a receiving layer after the resin composition is applied onto or impregnated into part of or the entire surface of a support is not particularly limited, but a drying method using a dryer is common. The drying temperature may be set to a temperature in a range in which the solvent can be volatilized and the support is not adversely affected.

The amount of the resin composition for forming a receiving layer, the resin composition adhering to a surface of the support, is preferably in the range of 0.01 to 20 $g/m^2$ in terms of resin solid content with respect to the area of the support considering the amount of solvent contained in a fluid such as a conductive ink, the thickness of a conductive pattern, and the like. The amount of the resin composition adhering to a surface of the support is particularly preferably in the range of 0.01 to 10 $g/m^2$ considering a property of absorbing a solvent contained in a fluid and the production cost.

By increasing the amount of the resin composition for forming a receiving layer, the resin composition adhering to a surface of the support, the fine-line-forming property of the receiving substrate can be further improved. However, an increase in the amount of the resin composition tends to make the texture of the resulting receiving substrate somewhat hard. Accordingly, for example, in the case where good flexibility is required, e.g., in the case of a flexible printed circuit board that can be bent, the resin composition is preferably applied so as to have a relatively small thickness of about 0.02 to 10 g/m$^2$. On the other hand, the resin composition may be used in an embodiment in which the resin composition has a relatively large thickness of about 10 to 100 g/m$^2$ depending on, for example, the application of the receiving substrate.

The receiving substrate of the present invention produced by the method described above can be suitably used when a conductive ink is used as the fluid. In particular, the receiving substrate can be suitably used for forming a conductive pattern or the like in, for example, the printed electronics field. More specifically, the receiving substrate can be suitably used as a substrate for forming a circuit, the substrate being used in an electronic circuit, an integrated circuit, or the like.

Printing can be performed on the receiving substrate or the substrate for forming a circuit by using a conductive ink as the fluid. Specifically, printing is performed on a receiving layer that is included in the receiving substrate with a conductive ink, and a baking step is then performed. Thus, for example, a conductive pattern including a conductive substance composed of a metal such as silver, the conductive substance being contained in the conductive ink, can be formed on the receiving substrate.

Similarly to the above-described pigment ink and the like, the conductive ink that can be used as the fluid is a liquid or a viscous liquid having a viscosity of 0.1 to 500,000 mPa·s and preferably 0.5 to 10,000 mPa·s measured at about 25° C. with a B-type viscometer, and contains a solvent and a conductive substance, a pigment, or the like that is dispersed in the solvent. For example, in the case where the fluid is printed by an ink-jet printing method, a fluid having a viscosity in the range of 0.5 to 10,000 mPa·s is preferably used.

For example, an ink containing a conductive substance, a solvent, and as required, an additive such as a dispersing agent can be used as the conductive ink.

Examples of the conductive substance that can be used include transition metals and compounds thereof. Among these, ionic transition metals are preferably used. For example, transition metals such as copper, silver, gold, nickel, palladium, platinum, and cobalt are preferably used, and silver, gold, copper, and the like are more preferably used because a conductive pattern that has a low electrical resistance and that is highly resistant to corrosion can be formed.

Particulate conductive substances having an average particle diameter of about 1 to 50 nm are preferably used as the conductive substance. Note that the term "average particle diameter" refers to a center particle diameter (D50) and a value measured with a laser diffraction/scattering particle size distribution analyzer.

The conductive substance such as a metal is preferably contained in the range of 10% to 60% by mass relative to the total amount of the conductive ink.

Various types of organic solvents and aqueous media such as water can be used as the solvent in the conductive ink. The receiving substrate of the present invention can be suitably used in the case where a solvent-based conductive ink is used.

In the present invention, solvent-based conductive inks that mainly contain an organic solvent as the solvent of the conductive ink, water-based conductive inks that mainly contain water as the solvent, and conductive inks that contain both the organic solvent and water can be appropriately selected and used.

Among these, from the standpoint of improving the fine-line-forming property, adhesion, etc. of a conductive pattern or the like to be formed, conductive inks that contain both the organic solvent and water as the solvent of the conductive ink and solvent-based conductive inks that mainly contain an organic solvent as the solvent of the conductive ink are preferably used, and solvent-based conductive inks that mainly contain an organic solvent as the solvent of the conductive ink are more preferably used.

In particular, the receiving layer included in the receiving substrate of the present invention is preferably used in combination with a conductive ink that in particular contains a polar solvent as the organic solvent because bleeding, a decrease in adhesion, etc. that may be caused by the polar solvent can be sufficiently prevented and it is possible to realize a fine-line-forming property of such a level that an increase in integration density of electronic circuits or the like can be realized.

Examples of the solvent that can be used in the solvent-based conductive ink include polar solvents such as alcohol solvents, e.g., methanol, n-propanol, isopropyl alcohol, n-butanol, isobutyl alcohol, sec-butanol, tert-butanol, heptanol, hexanol, octanol, nonanol, decanol, undecanol, dodecanol, tridecanol, tetradecanol, pentadecanol, stearyl alcohol, allyl alcohol, cyclohexanol, terpineol, terpineol, and dihydroterpineol; glycol solvents, e.g., 2-ethyl-1,3-hexanediol, ethylene glycol, diethylene glycol, triethylene glycol, polyethylene glycol, propylene glycol, dipropylene glycol, 1,2-butanediol, 1,3-butanediol, 1,4-butanediol, and 2,3-butanediol; glycol ether solvents, e.g., ethylene glycol monomethyl ether, ethylene glycol monoethyl ether, ethylene glycol monobutyl ether, diethylene glycol monoethyl ether, diethylene glycol monomethyl ether, diethylene glycol monobutyl ether, ethylene glycol monoethyl ether acetate, ethylene glycol monomethyl ether acetate, ethylene glycol monobutyl ether acetate, diethylene glycol monoethyl ether acetate, diethylene glycol monobutyl ether acetate, diethylene glycol diethyl ether, diethylene glycol dimethyl ether, diethylene glycol dibutyl ether, tetraethylene glycol dimethyl ether, tetraethylene glycol monobutyl ether, propylene glycol monomethyl ether, dipropylene glycol monomethyl ether, tripropylene glycol monomethyl ether, propylene glycol monopropyl ether, dipropylene glycol monopropyl ether, propylene glycol monobutyl ether, dipropylene glycol monobutyl ether, tripropylene glycol monobutyl ether, propylene glycol monomethyl ether acetate, dipropylene glycol monomethyl ether acetate, propylene glycol diacetate, propylene glycol phenyl ether, and dipropylene glycol dimethyl ether; and glycerol.

Among the polar solvents, solvents having a hydroxyl group are preferably used from the standpoint of preventing bleeding of a conductive pattern or the like to improve a fine-line-forming property and preventing detachment of a conductive substance contained in the conductive ink from a surface of a receiving layer.

In the solvent-based conductive ink, ketone solvents such as acetone, cyclohexanone, and methyl ethyl ketone can be used in combination in order to adjust physical properties. Furthermore, non-polar solvents such as ester solvent, e.g., ethyl acetate, butyl acetate, 3-methoxybutyl acetate, and 3-methoxy-3-methyl-butyl acetate; hydrocarbon solvents such as toluene, in particular, hydrocarbon solvents having 8 or more carbon atoms, e.g., octane, nonane, decane, dodecane, tridecane, tetradecane, cyclooctane, xylene, mesitylene, ethylbenzene, dodecylbenzene, tetralin, trimethylbenzene, and cyclohexane may also be used in combination as required. Furthermore, solvents such as mineral spirits and solvent naphtha, which are mixed solvents, may also be used in combination.

However, since a receiving layer formed using the resin composition of the present invention for forming a receiving layer is particularly preferably used in combination with a conductive ink containing a polar solvent, the amount of non-polar solvent is preferably 0% to 40% by mass relative to the total amount of solvent contained in the conductive ink.

As the aqueous medium that can be used as a solvent of the conductive ink, the same as those exemplified as the aqueous medium (C) can be used. For example, only water may be used or a mixed solution of water and a water-soluble solvent may be used. As the water-soluble solvent, for example, polar solvents such as alcohols, e.g., methyl alcohol, ethyl alcohol, isopropyl alcohol, ethyl carbitol, ethyl cellosolve, and butyl cellosolve; and N-methylpyrrolidone are preferably used from the standpoint of preventing bleeding of a conductive pattern or the like to improve a fine-line-forming property and preventing detachment of a conductive substance contained in the conductive ink from a surface of a receiving layer.

The solvent in the conductive ink is preferably contained in the range of 40% to 90% by mass relative to the total amount of the conductive ink. The polar solvent is preferably contained in the range of 40% to 100% by mass relative to the total amount of the solvent.

The conductive ink may optionally contain various types of additives in addition to the metal and the solvent.

A dispersing agent can be used as the additive from the standpoint of improving dispersibility of the metal in the solvent.

Examples of the dispersing agent that can be used include amine polymer dispersing agents such as polyethyleneimine and polyvinylpyrrolidone; hydrocarbon polymer dispersing agents having carboxylic acid groups in their molecules, such as polyacrylic acid and carboxymethyl cellulose; and polymer dispersing agents having polar groups, such as polyvinyl alcohol, styrene-maleic acid copolymers, olefin-maleic acid copolymers, and copolymers having a polyethyleneimine moiety and a polyethylene oxide moiety in one molecule thereof. Polyvinyl alcohol may be used as a dispersing agent in the case where a solvent-based conductive ink is used.

Examples of a method for performing printing on the receiving substrate or the like with the conductive ink include an ink-jet printing method, a screen printing method, a letterpress reverse printing method, a gravure off-set printing method, an off-set printing method, a spin coating method, a spray coating method, a bar coating method, a die coating method, a slit coating method, a roll coating method, and a dip coating method.

In the ink-jet printing method, a device that is generally called an ink-jet printer can be used. Specific examples thereof include Konica Minolta EB100, XY100 (manufactured by Konica Minolta IJ Technologies, Inc.) and Dimatix materials printer DMP-3000 and Dimatix materials printer DMP-2831 (manufactured by FUJI FILM Corporation).

The screen printing method is a method in which a conductive ink is applied onto a surface of the receiving layer by using a mesh-like screen printing plate. Specifically, a conducting pattern having a predetermined pattern shape can be formed by printing a conductive pattern using a metal screen printing plate that is generally called a metal mesh so as to have the predetermined pattern shape.

The letterpress reverse printing method is a method including applying a conductive ink onto a blanket to form a surface coated with the conductive ink, and transferring the conductive ink to the receiving layer.

A silicone blanket composed of silicone is preferably used as the blanket.

First, a conductive ink is applied onto the blanket to form a layer composed of the conductive ink. Next, a relief printing plate including a plate corresponding to a predetermined pattern shape, as required, is pressed onto the layer composed of the conductive ink, whereby the conductive ink that is in contact with the relief printing plate is transferred from the blanket to a surface of the relief printing plate.

Subsequently, the blanket is brought into contact with the receiving layer, thereby transferring the conductive ink remaining on the blanket to a surface of the receiving layer. A conductive pattern having a predetermined pattern can be formed by this method.

An example of the gravure off-set printing method is conducted as follows. A conductive ink is supplied to a groove of an intaglio printing plate having a predetermined pattern shape. A blanket is then pressed onto the surface of the intaglio printing plate, thereby transferring the conductive ink onto the blanket. Next, the conductive ink on the blanket is transferred to the receiving layer.

For example, a gravure plate or a glass intaglio plate formed by etching a glass plate can be used as the intaglio printing plate.

A blanket having a multilayer structure including a silicone rubber layer, a polyethylene terephthalate layer, a sponge-like layer, etc. can be used as the blanket. In general, a blanket wound around a rigid cylinder, which is called a blanket cylinder, is used.

The electrical conduction property can be provided to printed matter, which is produced by performing printing on the receiving substrate by the method described above, by making conductive substances contained in the conductive ink be in close contact with each other and joining the conductive substances to each other.

Examples of the method for joining the conductive substances include baking by heating and light irradiation.

The baking is preferably conducted in the range of about 80° C. to 300° C. for about 2 to 200 minutes. The baking may be conducted in air. Alternatively, from the standpoint of preventing oxidation of the metal, part or all of the baking step may be conducted in a reducing atmosphere.

The baking step can be conducted by using, for example, an oven, a hot-air drying furnace, an infrared drying furnace, laser irradiation, flash-lamp irradiation, or microwaves.

In the case where the cross-linking agent (e1-2) is used and a cross-linked structure is formed after printing is conducted with a conductive ink or the like, the cross-linked structure is formed after the printing through the baking step. Thus, durability of printed matter of a conductive pattern or the like can be significantly improved.

In the case where the cross-linking reaction and the baking step are conducted at the same time, the heating temperature is preferably in the range of about 80° C. to 300° C., more preferably about 100° C. to 300° C., and particularly preferably about 120° C. to 300° C., though it depends on the type of cross-linking agent (E) used, the combination of cross-linkable functional groups, etc. When the support is relatively easily affected by heat, the upper limit of the temperature is preferably 200° C. or lower and more preferably 150° C. or lower.

On the surface of the printed matter obtained through the baking step, a conductive pattern is formed by the metal contained in the conductive ink. This conductive pattern can be used in, for example, a circuit board or an integrated circuit board of an electrical appliance.

As the conductive pattern, a pattern plated with a metal such as copper may be used in order to form a highly reliable wiring pattern that can maintain a good electrical conduction property without the occurrence of a disconnection or the like for a long time. Specifically, the conductive pattern includes, for example, a receiving layer on part of or the entire surface of the support, the receiving layer being formed by using the resin composition for forming a receiving layer; and a plating film formed by carrying plating nuclei on part of or the entire surface of the receiving layer by, for example, applying a plating nucleus agent, conducting a baking step or the like as required, and then conducting an electrolytic plating process, an electroless plating process, or an electroless plating process and a subsequent electrolytic plating process.

As the plating nucleus agent, a plating nucleus agent corresponding to the conductive ink exemplified as the fluid can be used. For example, a plating nucleus agent in which a plating nucleus, specifically, a conductive substance is dispersed in a solvent can be used.

For example, at least one selected from metal particles exemplified as a conductive substance that can be used in the conductive ink, oxides of the metals described above, and the metals, the surface of which is coated with an organic substance, can be used as the conductive substance contained in the plating nucleus agent.

Each of the above metal oxides is usually in an inactive (insulating) state. However, activity (the electrical conduction property) can be provided by, for example, treating the metal oxide with a reducing agent such as dimethylaminoborane to expose a metal.

Examples of the metals, the surface of which is coated with an organic substance, include metals included in resin particles (organic substance) prepared by an emulsion polymerization method or the like. Each of these surface-coated metals is usually in an inactive (insulating) state. However, activity (the electrical conduction property) can be provided by, for example, removing the organic substance by using a laser or the like to expose a metal.

The conductive substance contained in the plating nucleus agent preferably has an average particle diameter in the range of about 10 nm to 1 μm.

As the solvent used in the plating nucleus agent, it is possible to use the same as those exemplified as solvents such as an aqueous medium and an organic solvent that can be used in the conductive ink.

The electroless plating process is a process for forming an electroless plating film formed of a metal coating film by bringing an electroless plating solution into contact with a surface of a receiving substrate, the surface carrying plating nuclei composed of, for example, palladium or silver thereon, to deposit a metal such as copper contained in the electroless plating solution.

As the electroless plating solution, for example, a solution containing a conductive substance composed of a metal such as copper, nickel, chromium, cobalt, or tin, a reducing agent, and a solvent such as an aqueous medium or an organic solvent can be used.

Examples of the reducing agent that can be used include dimethylaminoborane, hypophosphorous acid, sodium hypophosphite, dimethylamine borane, hydrazine, formaldehyde, sodium borohydride, and phenols.

The electroless plating solution may contain, as required, complexing agents, for example, organic acids such as monocarboxylic acids, e.g., acetic acid and formic acid; dicarboxylic acids, e.g., malonic acid, succinic acid, adipic acid, maleic acid, and fumaric acid; hydroxycarboxylic acids, e.g., malic acid, lactic acid, glycolic acid, gluconic acid, and citric acid; amino acids, e.g., glycine, alanine, iminodiacetic acid, arginine, aspartic acid, and glutamic acid; and aminopolycarboxylic acids, e.g., iminodiacetic acid, nitrilotriacetic acid, ethylenediaminediacetic acid, ethylenediaminetetraacetic acid, and diethylenetriaminepentaacetic acid; soluble salts (such as sodium salts, potassium salts, and ammonium salts) of any of these organic acids; and amines, e.g., ethylenediamine, diethylenetriamine, and triethylenetetramine.

When the electroless plating solution is brought into contact with the surface of the receiving substrate on which the plating nuclei in the plating nucleus agent are carried, the temperature of the electroless plating solution is preferably in the range of about 20° C. to 98° C.

The electrolytic plating process is a process for forming an electrolytic plating film (metal coating film) by applying a voltage in a state in which an electrolytic plating solution is brought into contact with a surface (x) of a receiving substrate on which the plating nuclei are carried or a surface (y) of an electroless plating film formed by the electroless process to deposit a metal such as copper contained in the electrolytic plating solution on the surface (x) of the receiving substrate disposed on the negative electrode or the surface (y) of the electroless plating film formed by the electroless process.

As the electrolytic plating solution, a solution containing a conductive substance composed of a metal such as copper, nickel, chromium, cobalt, or tin, sulfuric acid or the like, and an aqueous medium can be used.

When the electrolytic plating solution is brought into contact with the surface of the receiving substrate on which the plating nuclei in the plating nucleus agent are carried, the temperature of the electrolytic plating solution is preferably in the range of about 20° C. to 98° C.

In the electroless plating process or the electrolytic plating process described above, a strongly acidic or strongly basic plating solution is often used, as described above. Therefore, when a common receiving substrate is used, a receiving layer of the receiving substrate is corroded and the receiving layer is often separated from a support.

In contrast, in the case where printing is performed on the receiving substrate of the present invention with a fluid such as a plating nucleus agent and a cross-linked structure in the receiving layer is then formed, the separation of the receiving layer from a support does not occur in the plating process. In particular, even when the support is composed of a polyimide resin or the like, the separation of the receiving layer does not occur. Thus, the receiving substrate of the present invention can be very suitably used in the production of the conductive pattern.

The conductive pattern described above can be suitably used in the formation of an electronic circuit using a silver ink or the like, the formation of layers and peripheral wiring that are included in an organic solar cell, an electronic book terminal, an organic EL device, an organic transistor, a flexible printed circuit board, RFID, etc., and the formation of a conducive pattern, more specifically, a circuit board in producing, for example, wiring of an electromagnetic wave shield of a plasma display.

Among conductive patterns produced by the method described above, a conductive pattern produced by performing printing with a fluid such as a conductive ink or a plating nucleus agent and then forming a cross-linked structure in a receiving layer can be provided with excellent durability of such a level that a good electrical conduction property can be maintained without causing, for example, separation of the receiving layer from a support even in the case where a plating process is performed. Accordingly, the conductive pattern can be suitably used in applications that particularly require durability among the formation of a substrate for forming a circuit using a silver ink or the like, the substrate being used in an electronic circuit or an integrated circuit; the formation of layers and peripheral wiring that are included in an organic solar cell, an electronic book terminal, an organic EL device, an organic transistor, a flexible printed circuit board, RFID, etc.; the formation of wiring of an electromagnetic wave shield of a plasma display, etc. In particular, a conductive pattern obtained through the above-described plating process can form a highly reliable wiring pattern that can maintain a good electrical conduction property without the occurrence of a disconnection or the like for a long time. Accordingly, such a conductive pattern can be used in the applications of a flexible printed circuit board (FPC), a tape for tape automated bonding (TAB), a film for chip-on-film (COF), and a printed wiring board (PWB), all of which are generally called a copper clad laminate (CCL).

EXAMPLES

The present invention will now be described in detail by way of Examples.

Reference Example 1

Production of Urethane Resin (A)-1

In a vessel which was equipped with a thermometer, a nitrogen gas-introducing tube, and a stirrer, and whose atmosphere was replaced with nitrogen, 100 parts by mass of a polyester polyol (polyester polyol prepared by reacting 1,4-cyclohexanedimethanol, neopentyl glycol, and adipic acid, the content of an alicyclic structure in the polyester polyol: 1.426 mmol/kg, hydroxyl equivalent: 1,000 g/eq.), 17.6 parts by mass of 2,2-dimethylolpropionic acid, 21.7 parts by mass of 1,4-cyclohexanedimethanol, and 106.2 parts by mass of dicyclohexylmethane diisocyanate were reacted in a mixed solvent of 178 parts by mass of methyl ethyl ketone. Thus, an organic solvent solution of a urethane prepolymer having an isocyanate group at a molecular end thereof was prepared.

Next, 13.3 parts by mass of triethylamine was added to the organic solvent solution of the urethane resin to neutralize some or all of carboxyl groups in the urethane resin. Furthermore, 380 parts by mass of water was added thereto, and the resulting mixture was sufficiently stirred. Thus, an aqueous dispersion of a urethane resin having an alicyclic structure and a carboxyl group was prepared.

Next, 8.8 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (A)-1 having a solid content of 30% by mass was prepared. The urethane resin (A)-1 thus prepared had an acid value of 30, a content of an alicyclic structure of 4.452 mmol/kg calculated from a ratio of the charged starting materials, and a weight-average molecular weight of 53,000.

Reference Example 2

Production of Urethane Resin (A)-2

In a vessel which was equipped with a thermometer, a nitrogen gas-introducing tube, and a stirrer, and whose atmosphere was replaced with nitrogen, 100 parts by mass of a polyester polyol (polyester polyol prepared by reacting neopentyl glycol, 1,6-hexanediol, and adipic acid, hydroxyl equivalent: 1,000 g/eq.), 12.6 parts by mass of 2,2-dimethylolpropionic acid, 5.5 parts by mass of 1,4-cyclohexanedimethanol, and 58.2 parts by mass of dicyclohexylmethane diisocyanate were reacted in a mixed solvent of 124 parts by mass of methyl ethyl ketone. Thus, an organic solvent solution of a urethane prepolymer having an isocyanate group at a molecular end thereof was prepared.

Next, 9.5 parts by mass of triethylamine was added to the organic solvent solution of the urethane resin to neutralize some or all of carboxyl groups in the urethane resin. Furthermore, 277 parts by mass of water was added thereto, and the resulting mixture was sufficiently stirred. Thus, an aqueous dispersion of a urethane resin having an alicyclic structure and a carboxyl group was prepared.

Next, 4.8 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (a1)-2 having a solid content of 30% by mass was prepared. The urethane resin (A)-2 thus prepared had an acid value of 30, a content of an alicyclic structure of 2.714 mmol/kg calculated from a ratio of the charged starting materials, and a weight-average molecular weight of 51,000.

Reference Example 3

Production of Urethane Resin (A)-3

In a vessel which was equipped with a thermometer, a nitrogen gas-introducing tube, and a stirrer, and whose atmosphere was replaced with nitrogen, 100 parts by mass of a polyester polyol (polyester polyol prepared by reacting 1,4-cyclohexanedimethanol, neopentyl glycol, and adipic acid, the content of an alicyclic structure in the polyester polyol: 1.426 mmol/kg, hydroxyl equivalent: 1,000 g/eq.), 17.6 parts by mass of 2,2-dimethylolpropionic acid, 21.7 parts by mass of 1,4-cyclohexanedimethanol, and 106.2 parts by mass of dicyclohexylmethane diisocyanate were reacted in a mixed solvent of 178 parts by mass of methyl ethyl ketone. Thus, an organic solvent solution of a urethane prepolymer having an isocyanate group at a molecular end thereof was prepared.

Next, 10 parts by mass of γ-aminopropyltriethoxysilane was mixed with the organic solvent solution of the urethane prepolymer to allow the urethane prepolymer to react with γ-aminopropyltriethoxysilane. Thus, an organic solvent solution of a urethane resin having an alicyclic structure, a carboxyl group, and a hydrolysable silyl group or a silanol group was prepared.

Next, 13.3 parts by mass of triethylamine was added to the organic solvent solution of the urethane resin to neutralize some or all of carboxyl groups in the urethane resin. Furthermore, 380 parts by mass of water was added thereto, and the resulting mixture was sufficiently stirred. Thus, an aqueous dispersion of a urethane resin was prepared.

Next, 8.8 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (a1)-3 having a solid content of 30% by mass was prepared. The urethane resin (a1)-3 thus prepared had an acid value of 30, a content of an alicyclic structure of 4.307 mmol/kg calculated from a ratio of the charged starting materials, and a weight-average molecular weight of 88,000.

Reference Example 4

Production of Urethane Resin (A)-4

In a vessel which was equipped with a thermometer, a nitrogen gas-introducing tube, and a stirrer, and whose atmosphere was replaced with nitrogen, 100 parts by mass of a polyether polyol ("PTMG2000", manufactured by Mitsubishi Chemical Corporation, hydroxyl equivalent: 1,000 g/eq.), 17.4 parts by mass of 2,2-dimethylolpropionic acid, 34.2 parts by mass of 1,4-cyclohexanedimethanol, 109.3 parts by mass of dicyclohexylmethane diisocyanate, and 31.5 parts by mass of isophorone diisocyanate were reacted in a mixed solvent of 178 parts by mass of methyl ethyl ketone. Thus, an organic solvent solution of a urethane prepolymer having an isocyanate group at a molecular end thereof was prepared.

Next, 12.5 parts by mass of γ-aminopropyltriethoxysilane was mixed with the organic solvent solution of the urethane prepolymer to allow the urethane prepolymer to react with γ-aminopropyltriethoxysilane. Thus, an organic solvent solution of a urethane resin having an alicyclic structure, a carboxyl group, and a hydrolysable silyl group or a silanol group was prepared.

Next, 13.1 parts by mass of triethylamine was added to the organic solvent solution of the urethane resin to neutralize some or all of carboxyl groups in the urethane resin. Furthermore, 488 parts by mass of water was added thereto, and the resulting mixture was sufficiently stirred. Thus, an aqueous dispersion of a urethane resin was prepared.

Next, 17 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (A)-4 having a solid content of 30% by mass was prepared. The urethane resin (A)-4 thus prepared had an acid value of 25, a content of an alicyclic structure of 3.921 mmol/kg calculated from a ratio of the charged starting materials, and a weight-average molecular weight of 99,000.

Reference Example 5

Production of Urethane Resin (A)-5

In a vessel which was equipped with a thermometer, a nitrogen gas-introducing tube, and a stirrer, and whose atmosphere was replaced with nitrogen, 100 parts by mass of a polycarbonate polyol (polycarbonate diol prepared by reacting 1,4-cyclohexanedimethanol and a carbonic acid ester and having an alicyclic structure, the content of the alicyclic structure in the polycarbonate polyol: 3,000 mmol/kg, hydroxyl equivalent: 1,000 g/eq.), 9.7 parts by mass of 2,2-dimethylolpropionic acid, 5.5 parts by mass of 1,4-cyclohexanedimethanol, and 51.4 parts by mass of dicyclohexylmethane diisocyanate were reacted in a mixed solvent of 111 parts by mass of methyl ethyl ketone. Thus, an organic solvent solution of a urethane prepolymer having an isocyanate group at a molecular end thereof was prepared.

Next, 7.3 parts by mass of triethylamine was added to the organic solvent solution of the urethane resin to neutralize some or all of carboxyl groups in the urethane resin. Furthermore, 355 parts by mass of water was added thereto, and the resulting mixture was sufficiently stirred. Thus, an aqueous dispersion of a urethane resin having an alicyclic structure and a carboxyl group was prepared.

Next, 4.3 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (A)-5 having a solid content of 30% by mass was prepared. The urethane resin (A)-5 thus prepared had an acid value of 24, a content of an alicyclic structure of 4.356 mmol/kg calculated from a ratio of the charged starting materials, and a weight-average molecular weight of 61,000.

Reference Example 6

Production of Urethane Resin (A)'-1

In a vessel which was equipped with a thermometer, a nitrogen gas-introducing tube, and a stirrer, and whose atmosphere was replaced with nitrogen, 100 parts by mass of a polyether polyol ("PTMG2000", manufactured by Mitsubishi Chemical Corporation, hydroxyl equivalent: 1,000 g/eq.), 7.9 parts by mass of 2,2-dimethylolpropionic acid, 3.0 parts by mass of neopentyl glycol, and 41.0 parts by mass of isophorone diisocyanate were reacted in a mixed solvent of 118 parts by mass of methyl ethyl ketone. Thus, an organic solvent solution of a urethane prepolymer having an isocyanate group at a molecular end thereof was prepared.

Next, 4.2 parts by mass of 3-aminopropyltriethoxysilane was mixed with the organic solvent solution of the urethane prepolymer to allow the urethane prepolymer to react with 3-aminopropyltriethoxysilane. Thus, an organic solvent solution of a urethane resin having a hydrolysable silyl group or a silanol group and a hydrophilic group was prepared.

Next, 5.9 parts by mass of triethylamine was added to the organic solvent solution of the urethane resin to neutralize some or all of carboxyl groups in the urethane resin. Furthermore, 230 parts by mass of water was added thereto, and the resulting mixture was sufficiently stirred. Thus, an aqueous dispersion of a urethane resin was prepared.

Next, 5.6 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (A)'-1 having a solid content of 30% by mass was prepared. The urethane resin (A)'-1 thus prepared had an acid value of 22, a content of an alicyclic structure of 1.172 mmol/kg calculated from a ratio of the charged starting materials, and a weight-average molecular weight of 97,000.

Reference Example 7

Production of Urethane Resin (A)'-2

In a vessel which was equipped with a thermometer, a nitrogen gas-introducing tube, and a stirrer, and whose atmosphere was replaced with nitrogen, 100 parts by mass of a polyester polyol (polyester polyol prepared by reacting 1,4-cyclohexanedimethanol, neopentyl glycol, and adipic acid, the content of an alicyclic structure in the polyester polyol: 1.425 mmol/kg, hydroxyl equivalent: 1,000 g/eq.), 49.7 parts by mass of 2,2-dimethylolpropionic acid, 127.1 parts by mass of 1,4-cyclohexanedimethanol, and 416.8 parts by mass of dicyclohexylmethane diisocyanate were reacted in a mixed solvent of 492 parts by mass of methyl ethyl ketone. Thus, an organic solvent solution of a urethane prepolymer having an isocyanate group at a molecular end thereof was prepared.

Next, 37.5 parts by mass of triethylamine was added to the organic solvent solution of the urethane resin to neutralize some or all of carboxyl groups in the urethane resin. Furthermore, 1,083 parts by mass of water was added thereto, and the resulting mixture was sufficiently stirred. Thus, an aqueous dispersion of a urethane resin having an alicyclic structure and a carboxyl group was prepared.

Next, 34.4 parts by mass of a 25 mass % aqueous solution of ethylenediamine was added to the aqueous dispersion, and the resulting aqueous dispersion was stirred, thereby conducting chain extension of the particulate polyurethane resin. Subsequently, the aqueous dispersion was subjected to aging and removal of the solvent. Thus, an aqueous dispersion of a urethane resin (A)'-2 having a solid content of 30% by mass was prepared. The urethane resin (A)'-2 thus prepared had an acid value of 30, a content of an alicyclic structure of 5.984 mmol/kg calculated from a ratio of the charged starting materials, and a weight-average molecular weight of 70,000.

Reference Example 8

Production of Vinyl Polymer (B)-1

In a reaction vessel equipped with a stirrer, a reflux condenser, a nitrogen gas-introducing tube, a thermometer, and dropping funnels, 115 parts by mass of deionized water and 4 parts by mass of LATEMUL E-118B (manufactured by Kao Corporation, active ingredient: 25% by mass) were put, and the temperature was increased to 75° C. while blowing nitrogen.

Part (5 parts by mass) of a monomer pre-emulsion prepared by mixing a vinyl monomer mixture containing 60.0 parts by mass of methyl methacrylate, 38.0 parts by mass of n-butyl acrylate, and 2.0 parts by mass of methacrylic acid, 4 parts by mass of Aquaron KH-1025 (manufactured by Dai-ichi Kogyo Seiyaku Co., Ltd., active ingredient: 25% by mass), and 15 parts by mass of deionized water was added to the reaction vessel under stirring. Subsequently, 0.1 parts by mass of potassium persulfate was added thereto, and polymerization was conducted for 60 minutes while maintaining the temperature in the reaction vessel at 75° C.

Next, the rest (114 parts by mass) of the monomer pre-emulsion and 30 parts by mass of an aqueous solution (active ingredient: 1.0% by mass) of potassium persulfate were respectively added dropwise over a period of 180 minutes using two dropping funnels while maintaining the temperature in the reaction vessel at 75° C. After the completion of the dropwise addition, the resulting mixture was stirred at the same temperature for 60 minutes.

The temperature in the reaction vessel was decreased to 40° C., and aqueous ammonia (active ingredient: 10% by mass) was used so that the pH of the aqueous dispersion in the reaction vessel became 8.5.

Subsequently, deionized water was used so that the non-volatile content became 20.0% by mass, and the resulting mixture was then filtered with a 200-mesh filter cloth. Thus, an aqueous dispersion of a vinyl polymer (B)-1 was prepared.

Example 1

Preparation of Resin Composition (I-1) for Forming Receiving Layer and Preparation of Receiving Substrates (II-1) Using the Resin Composition The aqueous dispersion of the urethane resin (A)-1 and the aqueous dispersion of the vinyl polymer (B)-1 prepared above were mixed so that a ratio represented by aqueous dispersion of urethane resin (A)-1: aqueous dispersion of vinyl polymer (B-1) was 100:350 (solid content mass ratio 30:70), and deionized water was used so that the non-volatile content became 20% by mass. The resulting mixture was then filtered with a 200-mesh filter cloth. Thus, a resin composition (I-1) for forming a receiving layer used in the present invention was prepared.

The resin composition (I-1) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of receiving substrates (II-1) each including a support and a receiving layer formed on the support were prepared.

[Supports]

(i) PET; polyethylene terephthalate film (manufactured by Toyobo Co., Ltd., Cosmoshine A4300, thickness: 50 μm)

(ii) PI; Polyimide film (manufactured by Du Pont-Toray Co., Ltd., Kapton 200H, thickness 50 μm)

(iii) GL; glass: glass plate, JIS R3202, thickness 2 mm

Example 2

Preparation of Resin Composition (I-2) for Forming Receiving Layer and Preparation of Receiving Substrates (II-2) Using the Resin Composition In a reaction vessel equipped with a stirrer, a reflux condenser, a nitrogen gas-introducing tube, a thermometer, a dropping funnel for dropping a monomer mixture, and a dropping funnel for dropping a polymerization catalyst, 140 parts by mass of deionized water and 100 parts by mass of the aqueous dispersion of the urethane resin (A)-1 were put, and the temperature was increased to 80° C. while blowing nitrogen.

In order to prepare a vinyl polymer (B)-2 constituting a core layer, a monomer mixture containing 60.0 parts by mass of methyl methacrylate and 40.0 parts by mass of n-butyl acrylate, and 20 parts by mass of an aqueous solution of ammonium persulfate (concentration: 0.5% by mass) were added dropwise to the reaction vessel, the temperature of which was increased to 80° C., from the separate dropping funnels under stirring over a period of 120 minutes while maintaining the temperature in the reaction vessel at 80° C.±2° C., thus conducting polymerization.

After the completion of the dropwise addition, the resulting mixture was stirred at the same temperature for 60 minutes. Thus, an aqueous dispersion of composite resin particles (C)-1 each including a shell layer composed of the urethane resin (A)-1 and a core layer composed of the vinyl polymer (B)-2 was prepared.

The temperature in the reaction vessel was decreased to 40° C., and deionized water was used so that the non-volatile content became 20.0% by mass. The resulting aqueous dispersion was then filtered with a 200-mesh filter cloth. Thus, a resin composition (I-2) for forming a receiving layer used in the present invention was prepared.

The above resin composition (I-2) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of receiving substrates (II-2) each including a support and a receiving layer formed on the support were prepared.

Examples 3 to 5

Preparation of Resin Compositions (I-3) to (I-5) for Forming Receiving Layer and Preparation of Receiving Substrates (II-3) to (II-5) Using the Resin Compositions Resin compositions (I-3) to (I-5) for forming a receiving layer, the resin compositions each having a non-volatile content of 20% by mass, were prepared by the same method as described in Example 2 except that the type of urethane resin was changed to (A)-1 to (A)-3 described in Table 1 below and the composition of the vinyl monomers used in the production of the vinyl polymer was changed to the compositions described in Table 1 below.

Each of the above resin compositions (I-3) to (I-5) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of receiving substrates (II-3) to (II-5) each including a support and an ink-receiving layer formed on the support were prepared.

Example 6

Preparation of Resin Composition (I-6) for Forming Receiving Layer and Preparation of Receiving Substrates (II-6) Using the Resin Composition First, 200 parts by mass of the resin composition (I-2) for forming a receiving layer, 3.0 parts by mass of a melamine compound [Beckamine M-3 (manufactured by DIC Corporation)], and deionized water were mixed to prepare a resin composition (I-6) for forming a conductive receiving layer, the resin composition having a non-volatile content of 20% by mass.

The above resin composition (I-6) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of ink-receiving substrates (II-6) each including a support and a receiving layer formed on the support were prepared.

Examples 7 to 11

Preparation of Resin Compositions (I-7) to (I-11) for Forming Receiving Layer and Preparation of Ink-Receiving Substrates (II-7) to (II-11) Using the Resin Compositions Resin compositions (I-7) to (I-11) for forming a receiving layer, the resin compositions each having a non-volatile content of 20% by mass, were prepared by the same method as described in Example 2 except that the type of urethane resin was changed to (A)-1 to (A)-5 described in Table 1 below and the composition of the vinyl monomers used in the production of the vinyl polymer was changed to the compositions described in Tables 1 and 2 below.

Each of the above resin compositions (I-7) to (I-11) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of receiving substrates (II-7) to (II-11) each including a support and a receiving layer formed on the support were prepared.

Comparative Examples 1 and 2

Preparation of Resin Compositions (I'-1) and (I'-2) for Forming Receiving Layer and Preparation of Receiving Substrates (II'-1) and (II'-2) Using the Resin Compositions Resin compositions (I'-1) and (I'-2) for forming a receiving layer, the resin compositions each having a non-volatile content of 20% by mass, were prepared by the same method as described in Example 2 except that the type of urethane resin was changed to (A)'-1 and (A)'-2 described in Table 1 below and the composition of the vinyl monomers used in the production of the vinyl polymer was changed to the compositions described in Table 2 below.

Each of the above resin compositions (I'-1) and (I'-2) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of receiving substrates (I'-1) and (I'-2) each including a support and a receiving layer formed on the support were prepared.

Comparative Example 3

Preparation of Resin Composition for Forming Receiving Layer and Preparation of Receiving Substrates (II'-3) Using the Resin Composition An aqueous dispersion of the urethane resin (A)-1 prepared above was used as a resin composition (I'-3) for forming a receiving layer.

The resin composition (I'-3) for forming a receiving layer was applied onto surfaces of three types of supports represented by (i) to (iii) below using a bar coater so that the dry film thickness became 3 μm. The resulting supports were dried at 70° C. for three minutes using a hot-air dryer. Thus, three types of receiving substrates (II'-3) each including a support and an ink-receiving layer formed on the support were prepared.

TABLE 1

| | | | Example 1 | Example 2 | Example 3 | Example 4 | Example 5 | Example 6 | Example 7 |
|---|---|---|---|---|---|---|---|---|---|
| Urethane resin | Type | | (A)-1 | (A)-1 | (A)-2 | (A)-1 | (A)-1 | (A)-1 | (A)-3 |
| | Alicyclic structure (mmol/kg) | | 4452 | 4452 | 2714 | 4452 | 4452 | 4452 | 4307 |
| | Parts by mass | | 100 | 100 | 100 | 100 | 100 | 100 | 100 |
| Vinyl polymer | MMA | Parts by mass | 60 | 60 | 60 | 50 | 40 | 60 | 60 |
| | BA | | 38 | 40 | 40 | 30 | 30 | 30 | 40 |
| | NBMAM | | — | — | — | 20 | 20 | — | — |

TABLE 1-continued

|  | Example 1 | Example 2 | Example 3 | Example 4 | Example 5 | Example 6 | Example 7 |
|---|---|---|---|---|---|---|---|
| HEMA | — | — | — | — | 10 | — | — |
| 4HBA | — | — | — | — | — | 10 | — |
| MAA | 2 | — | — | — | — | — | — |
| Cross-linking agent 1 | — | — | — | — | — | 10 | — |
| Component that forms cross-linked structure | Not contained | Not contained | Not contained | NBMAM | NBMAM/HEMA | Cross-linking agent 1 | Not contained |
| Urethane resin/Vinyl polymer | 23/77 | 23/77 | 23/77 | 23/77 | 23/77 | 23/77 | 23/77 |

TABLE 2

|  |  | Example 8 | Example 9 | Example 10 | Example 11 | Comparative Example 1 | Comparative Example 2 | Comparative Example 3 |
|---|---|---|---|---|---|---|---|---|
| Urethane resin | Type | (A)-3 | (A)-1 | (A)-4 | (A)-5 | (A)'-1 | (A)'-2 | (A)-1 |
|  | Alicyclic structure (mmol/kg) | 4307 | 4452 | 3921 | 4356 | 1172 | 5984 | 4452 |
|  | Parts by mass | 100 | 100 | 100 | 100 | 100 | 100 | 100 |
| Vinyl polymer | MMA  Parts by mass | 40 | 50 | 50 | 50 | 60 | 60 | — |
|  | BA | 30 | 35 | 35 | 35 | 40 | 40 | — |
|  | NBMAM | 20 | 10 | 10 | 10 | — | — | — |
|  | HEMA | 10 | — | — | — | — | — | — |
|  | 4HBA | — | 5 | 5 | 5 | — | — | — |
|  | MAA | — | — | — | — | — | — | — |
| Cross-linking agent 1 |  | — | — | — | — | — | — | — |
| Component that forms cross-linked structure |  | NBMAM/HEMA | NBMAM/4HBA | NBMAM/4HBA | NBMAM/4HBA | Not contained | Not contained | Not contained |
| Urethane resin/Vinyl polymer |  | 23/77 | 50/50 | 50/50 | 50/50 | 23/77 | 23/77 | 100/0 |

DESCRIPTION OF ABBREVIATIONS IN TABLES 1 AND 2

MMA: methyl methacrylate
BA: n-butyl acrylate
NBMAM: N-n-butoxymethylacrylamide
HEMA: 2-hydroxyethyl methacrylate
4HBA: 4-hydroxybutyl acrylate
MAA: methacrylic acid
Cross-linking agent 1: melamine compound (Beckamine M-3 manufactured by DIC Corporation, trimethoxymethylmelamine)

[Method for Determining Content of Alicyclic Structure]

The content of an alicyclic structure was calculated on the basis of the total mass of all the starting materials, such as a polyol and a polyisocyanate, which were used in the production of the urethane resin and the amount of substances of alicyclic structures included in compounds having alicyclic structures (such as a polyol having an alicyclic structure and a polyisocyanate having an alicyclic structure), the compounds being used in the production of the urethane resin.

[Method for Evaluating Adhesion Between Support and Receiving Layer]

A cellophane adhesive tape (manufactured by Nichiban Co., Ltd., CT405AP-24, 24 mm) was applied onto a surface (onto a receiving layer) of each receiving substrate by pressing with a finger before printing was conducted. The cellophane adhesive tape was then peeled off in a direction at an angle of 90 degrees with respect to the surface of the receiving substrate. The adhesive surface of the peeled cellophane adhesive tape was visually observed. The adhesion was evaluated on the basis of the presence or absence of a substance adhering to the adhesive surface of the tape.

A receiving substrate in which no receiving layer adhered to the adhesive surface of the peeled cellophane adhesive tape was evaluated as "A". A receiving substrate in which less than about 5% of the area of the receiving layer relative to the adhering area of the adhesive tape was detached from the support and adhered to the adhesive tape was evaluated as "B". A receiving substrate in which about 5% or more and less than 50% of the area of the receiving layer relative to the adhering area of the adhesive tape was detached from the support and adhered to the adhesive tape was evaluated as "C". A receiving substrate in which about 50% or more of the area of the receiving layer relative to the adhering area of the adhesive tape was detached from the support and adhered to the adhesive tape was evaluated as "D".

[Method for Evaluating Printing Properties]

Printing was performed with solvent-based pigment inks of nine colors below, the inks each serving as a fluid and containing a glycol-based highly polar solvent and a pigment, on a surface of a receiving substrate prepared by using, as a support, the "(i) PET; polyethylene terephthalate film (manufactured by Toyobo Co., Ltd., Cosmoshine A4300, thickness: 50 μm)" in an overlapping manner in the order described below using an ink-jet printer (SP-300V manufacture by Roland DG Corporation). Thus, printed matter of 100% solid image to 400% solid image was obtained.

[Description of Nine Color Inks]
C 100% ink
Y 100% ink
M 100% ink
Bk 100% ink
Total 200% ink containing C 100% and M 100%
Total 200% ink containing M 100% and Y 100%
Total 200% ink containing Y 100% and C 100%
Total 300% ink containing C 100%, M 100%, and Y 100%
Total 400% ink containing C 100%, M 100%, Y 100%, and K 100%

Printing properties of a printed image obtained by performing printing with the solvent-based pigment inks were evaluated on the basis of the criteria below.

A: No uneven color, bleeding, cracks, and the like were generated on a printed image formed by using the "total 400% ink", and a uniform printed image was formed.

B: No uneven color, bleeding, cracks, and the like were generated on a printed image formed by using the "total 300% ink". However, bleeding and an uneven color were somewhat generated on a printed image obtained by performing printing on the above printed image using the "total 400% ink".

C: No uneven color, bleeding, cracks, and the like were generated on a printed image formed by using the "total 200% ink containing C 100% and M 100%", the "total 200% ink containing M 100% and Y 100%" and the "total 200% ink containing Y 100% and C 100%". However, bleeding and an uneven color were generated on a printed image obtained by performing printing on the above printed image using the "total 300% ink".

D: No uneven color, bleeding, cracks, and the like were generated on a printed image formed by using the "C 100% ink", the "Y 100% ink", the "M 100% ink", and the "Bk 100% ink". However, bleeding and an uneven color were generated on a printed image obtained by performing printing on the above printed image using the "total 200% inks".

E: Bleeding, an uneven color, cracks, and the like were generated on a printed image even in each of the cases where printing was conducted using the "C 100% ink", the "Y 100% ink", the "M 100% ink", and the "Bk 100% ink".

[Method for Preparing Conductive Ink Serving as Fluid]
[Method for Preparing Ink]
[Preparation of Nano-Silver Ink 1 for Ink-Jet Printing]

A solvent-based nano-silver ink 1 for ink-jet printing was prepared by dispersing silver particles having an average particle diameter of 30 nm in a mixed solvent containing 65 parts by mass of diethylene glycol diethyl ether, 18 parts by mass of γ-butyrolactone, 15 parts by mass of tetraethylene glycol dimethyl ether, and 2 parts by mass of tetraethylene glycol monobutyl ether.

[Preparation of Nano-Silver Ink 2 for Ink-Jet Printing]

A solvent-based nano-silver ink 2 for ink-jet printing was prepared by dispersing silver particles having an average particle diameter of 30 nm in tetradecane serving as a solvent.

[Preparation of Silver Paste for Screen Printing]

A silver paste (NPS, manufactured by Harima Chemicals Group, Inc.) was used.

[Printing by Ink-Jet Printing Method]

A straight line having a line width of 100 μm and a film thickness of 0.5 μm was printed on surfaces of the three types of receiving substrates obtained by using the supports (i), (ii), and (iii) so as to have a length of about 1 cm with each of the nano-silver inks 1 and 2 for ink-jet printing using an ink-jet printer (manufactured by Konica Minolta IJ Technologies, Inc., ink-jet testing device EB100, printer head for evaluation: KM512L, the amount of ejection: 42 pL). The receiving substrates were then dried at 150° C. for 30 minutes to prepare printed matter (conductive patterns). In the case where the receiving substrates described in Examples 4 to 6 and 8 to 11 were used, a cross-linked structure was formed in the receiving layers through the drying step at 150° C. for 30 minutes after the printing was performed with the conductive inks. Whether the cross-linked structure was formed or not was determined on the basis of "a gel fraction of a conductive-ink-receiving layer formed by drying at room temperature (23° C.) and then heating at 70° C." and "a gel fraction of a conductive-ink-receiving layer formed by further heating at 150° C.", as shown in Tables 3 and 4. Specifically, when the gel fraction of a conductive-ink-receiving layer prepared by heating at 150° C. was increased by 25% by mass or more as compared with the gel fraction of a conductive-ink-receiving layer prepared by drying at room temperature and then heating at 70° C. (non-cross-linked state), it was determined that a cross-linked structure was formed by high-temperature heating.

The gel fraction of a receiving layer formed by drying at room temperature (23° C.) and then heating at 70° C. was calculated by a method described below.

A resin composition for forming a receiving layer was poured onto a polypropylene film surrounded by thick paper so that a film thickness after drying became 100 μm. The resin composition was dried at a temperature of 23° C. and a humidity of 65% for 24 hours, and then heat-treated at 70° C. for three minutes to form a receiving layer. The receiving layer was separated from the polypropylene film and then cut to have a size of 3 cm in length and 3 cm in width. This receiving layer was used as a test piece. The mass (X) of the test piece 1 was measured, and the test piece 1 was then immersed in 50 mL of methyl ethyl ketone, the temperature of which was adjusted to 25° C., for 24 hours.

A residue (insoluble component) of the test piece 1 that was not dissolved in methyl ethyl ketone by the immersion was filtered with a 300-mesh metal net.

The residue obtained above was dried at 108° C. for one hour, and the mass (Y) of the dry residue was measured.

Next, a gel fraction was calculated on the basis of a formula $[(Y)/(X)] \times 100$ using the values of the masses (X) and (Y).

The "gel fraction of a receiving layer formed by heating at 150° C." was calculated by a method described below.

A resin composition for forming a receiving layer was poured onto a polypropylene film surrounded by thick paper so that a film thickness after drying became 100 μm. The resin composition was dried at a temperature of 23° C. and a humidity of 65% for 24 hours, and then dried by heating at 150° C. for 30 minutes to form a receiving layer. The receiving layer was separated from the polypropylene film and then cut to have a size of 3 cm in length and 3 cm in width. This receiving layer was used as a test piece 2. The mass (X') of the test piece 2 was measured, and the test piece 2 was then immersed in 50 mL of methyl ethyl ketone, the temperature of which was adjusted to 25° C., for 24 hours.

A residue (insoluble component) of the test piece 2 that was not dissolved in methyl ethyl ketone by the immersion was filtered with a 300-mesh metal net.

The residue obtained above was dried at 108° C. for one hour, and the mass (Y') of the dry residue was measured.

Next, a gel fraction was calculated on the basis of a formula $[(Y')/(X')] \times 100$ using the values of the masses (X') and (Y').

[Printing by Screen Printing Method]

A straight line having a line width of 50 μm and a film thickness of 1 μm was printed on surfaces of the three types of receiving substrates obtained by using the supports (i), (ii), and (iii) so as to have a length of about 1 cm with the silver paste for screen printing using a metal-mesh 250 screen printing plate. The receiving substrates were then dried at 150° C. for 30 minutes to prepare printed matter (conductive patterns).

Regarding the receiving substrates described in Examples 4 to 6 and 8 to 11, a cross-linked structure was formed in the receiving layers through the drying step at 150° C. for 30 minutes after the printing was performed with the ink. The presence or absence of the cross-lined structure was determined by the same method described above.

[Method for Evaluating Fine-Line-Forming Property]

The entire printed portion (line portion) formed on the surface of the printed matter (conductive pattern) prepared by the method described above was observed with an optical microscope (digital microscope VHX-100, manufactured by Keyence Corporation) to check the presence or absence of bleeding of the printed portion.

Specifically, in the case where bleeding was not observed on the outer edge of the printed portion (line portion), the boundary between the printed portion and the non-printed portion was clear, and there was no difference in height between the outer edge and a central portion of the line portion and the line portion was flat and smooth as a whole, the printed matter was evaluated as "A". In the case where bleeding was somewhat observed in a small portion of the outer edge of the printed portion (line portion), but the boundary between the printed portion and the non-printed portion was clear and the line portion was flat and smooth as a whole, the printed matter was evaluated as "B". In the case where bleeding was somewhat observed within a range of about ⅓ of the outer edge of the printed portion (line portion) and the boundary between the printed portion and the non-printed portion was partially unclear in the bleeding portion, but the line portion was flat and smooth as a whole and at such a level that the line portion could be used, the printed matter was evaluated as "C". In the case where bleeding was observed within a range of about ⅓ to ½ of the outer edge of the printed portion (line portion), the boundary between the printed portion and the non-printed portion was partially unclear in the bleeding portion, and the outer edge and a central portion of the line portion was not flat and smooth, the printed matter was evaluated as "D". In the case where bleeding was observed within a range of about ½ or more of the outer edge of the printed portion (line portion), the boundary between the printed portion and the non-printed portion was partially unclear in the bleeding portion, and the outer edge and a central portion of the line portion was not flat and smooth, the printed matter was evaluated as "E".

[Method for Evaluating Electrical Conduction Property]

A rectangular region (area) having a length of 3 cm and a width of 1 cm was printed on surfaces of two types of receiving substrates obtained by using the supports (i) and (ii) so as to have a film thickness of 0.5 μm with the nano-silver ink 1 for ink-jet printing using an ink-jet printer (manufactured by Konica Minolta IJ Technologies, Inc., ink-jet testing device EB100, printer head for evaluation: KM512L, the amount of ejection: 42 pL). The receiving substrates were then dried at 150° C. for 30 minutes to prepare printed matter (conductive patterns). In the case where the receiving substrates described in Examples 4 to 6 and 8 to 11 were used, a cross-linked structure was formed in the ink-receiving layers through the drying step at 150° C. for 30 minutes after the printing was performed with the ink.

Furthermore, a rectangular region (area) having a length of 3 cm and a width of 1 cm was printed on surfaces of two types of receiving substrates obtained by using the supports (i) and (ii) so as to have a film thickness of 1 μm using the silver paste for screen printing with a metal-mesh 250 screen printing plate. The receiving substrates were then dried at 150° C. for 30 minutes to prepare printed matter (conductive patterns).

The volume resistivity of a solid printed portion of the rectangular region having a length of 3 cm and a width of 1 cm and formed on the surface of the printed matter (conductive pattern) obtained by the method described above was measured using a LORESTA resistivity meter (MCP-T610 manufactured by Mitsubishi Chemical Corporation). Printed matter having a volume resistivity of less than $5 \times 10^{-6}$ Ω·cm was evaluated as "A". Printed matter which had a volume resistivity of $5 \times 10^{-6}$ Ω·cm or more and less than $9 \times 10^{-6}$ Ω·cm and which was at such a level that the printed matter could be satisfactorily used was evaluated as "B". Printed matter which had a volume resistivity of $9 \times 10^{-6}$ Ω·cm or more and less than $5 \times 10^{-5}$ Ω·cm and which was at such a level that the printed matter could be used was evaluated as "C". Printed matter having a volume resistivity of $5 \times 10^{-5}$ Ω·cm or more and less than $9 \times 10^{-5}$ Ω·cm was evaluated as "D". Printed matter which had a volume resistivity of $9 \times 10^{-5}$ Ω·cm or more and which was difficult to be used in practical applications was evaluated as "E".

[Method for Evaluating Durability after Electroless Plating Process]

A solvent-based plating nucleus agent 1 was prepared by dispersing silver particles (plating nuclei) having an average particle diameter of 30 nm in a mixed solvent containing 65 parts by mass of diethylene glycol diethyl ether, 18 parts by mass of γ-butyrolactone, 15 parts by mass of tetraethylene glycol dimethyl ether, and 2 parts by mass of tetraethylene glycol monobutyl ether.

Solid printing of a square region (area) having a length of 5 cm and a width of 5 cm was conducted on surfaces of receiving substrates each obtained by using the support (ii) so as to have a film thickness of 0.5 μm with the plating nucleus agent 1 using an ink-jet printer (manufactured by Konica Minolta IJ Technologies, Inc., ink-jet testing device EB100, printer head for evaluation: KM512L, the amount of ejection: 42 pL). The receiving substrates were then dried at 150° C. for 30 minutes to prepare printed matter. Regarding the receiving substrates described in Examples 4 to 6 and 8 to 11, a cross-linked structure was formed in the receiving layers through the drying step at 150° C. for 30 minutes after the printing was conducted with the plating nucleus agent 1.

An activating agent (ACE CLEAN A220, manufactured by Okuno Chemical Industries Co., Ltd.) was applied onto the surface (surface on which the plating nuclei were carried) of the printed matter prepared above, and an activating treatment of the plating nuclei was conducted at 55° C. for five minutes.

Subsequently, an electroless copper plating solution (OPC-750, manufactured by Okuno Chemical Industries Co., Ltd.) was applied onto the surface on which the activating treatment had been conducted, and an electroless copper plating process was conducted at 20° C. for 20 minutes.

Thus, a conductive pattern X (plating structure X) was prepared in which a plating coating film composed of copper was formed on the surface that carries the plating nuclei thereon.

A cellophane adhesive tape (manufactured by Nichiban Co., Ltd., CT405AP-24, 24 mm) was applied onto the surface of the plating film of the conductive pattern X (plating structure X) prepared above by pressing with a finger. The cellophane adhesive tape was then peeled off in a direction at an angle of 90 degrees with respect to the surface of the conductive pattern X (plating structure X). The adhesive surface of the peeled cellophane adhesive tape was visually observed. The adhesion was evaluated on the basis of the presence or absence of a substance adhering to the adhesive surface of the tape.

A conductive pattern in which no substance adhered to the adhesive surface of the peeled cellophane adhesive tape was evaluated as "A". A conductive pattern in which less than about 5% of the area of any of the metal plating, silver, and the receiving layer relative to the adhering area of the adhesive tape was detached from the support and adhered to the adhesive tape was evaluated as "B". A conductive pattern in which about 5% or more and less than 50% of the area of any of the metal plating, silver, and the receiving layer relative to the adhering area of the adhesive tape was detached from the support and adhered to the adhesive tape was evaluated as "C". A conductive pattern in which about 50% or more of the area of any of the metal plating, silver, and the receiving layer relative to the adhering area of the adhesive tape was detached from the support and adhered to the adhesive tape was evaluated as "D".

[Method for Evaluating Durability after Electrolytic Plating Process]

A solvent-based plating nucleus agent 1 was prepared by dispersing silver particles (plating nuclei) having an average particle diameter of 30 nm in a mixed solvent containing 65 parts by mass of diethylene glycol diethyl ether, 18 parts by mass of γ-butyrolactone, 15 parts by mass of tetraethylene glycol dimethyl ether, and 2 parts by mass of tetraethylene glycol monobutyl ether.

Solid printing of a square region (area) having a length of 5 cm and a width of 5 cm was conducted on surfaces of receiving substrates each obtained by using the support (ii) so as to have a film thickness of 0.5 μm with the plating nucleus agent 1 using an ink-jet printer (manufactured by Konica Minolta IJ Technologies, Inc., ink-jet testing device EB100, printer head for evaluation: KM512L, the amount of ejection: 42 μL). The receiving substrates were then dried at 150° C. for 30 minutes to prepare printed matter. Regarding the receiving substrates described in Examples 4 to 6 and 8 to 11, a cross-linked structure was formed in the receiving layers through the drying step at 150° C. for 30 minutes after the printing was conducted with the plating nucleus agent 1.

An activating agent (ACE CLEAN A220, manufactured by Okuno Chemical Industries Co., Ltd.) was applied onto the surface (surface on which the plating nuclei were carried) of the printed matter prepared above, and an activating treatment of the plating nuclei was conducted at 55° C. for five minutes.

Subsequently, a copper sulfate plating solution (TOP LUCINA 81SW, manufactured by Okuno Chemical Industries Co., Ltd.) was applied onto the surface on which the activating treatment had been conducted, and an electrolytic plating process was conducted at 25° C., at 3 Amp, and 90 min/dm$^2$. Thus, a conductive pattern Y (plating structure Y) was prepared in which a plating coating film composed of copper was stacked on the surface of the copper plating film of the conductive pattern X (plating structure X).

A cellophane adhesive tape (manufactured by Nichiban Co., Ltd., CT405AP-24, 24 mm) was applied onto the surface of the plating film of the conductive pattern Y (plating structure Y) prepared above by pressing with a finger. The cellophane adhesive tape was then peeled off in a direction at an angle of 90 degrees with respect to the surface of the conductive pattern X (plating structure X). The adhesive surface of the peeled cellophane adhesive tape was visually observed. The adhesion was evaluated on the basis of the presence or absence of a substance adhering to the adhesive surface of the tape.

A conductive pattern in which no substance adhered to the adhesive surface of the peeled cellophane adhesive tape was evaluated as "A". A conductive pattern in which less than about 5% of the area of any of the metal plating, silver, and the receiving layer relative to the adhering area of the adhesive tape was detached from the support and adhered to the adhesive tape was evaluated as "B". A conductive pattern in which about 5% or more and less than 50% of the area of any of the metal plating, silver, and the receiving layer relative to the adhering area of the adhesive tape was detached from the support and adhered to the adhesive tape was evaluated as "C". A conductive pattern in which about 50% or more of the area of any of the metal plating, silver, and the receiving layer relative to the adhering area of the adhesive tape was detached from the support and adhered to the adhesive tape was evaluated as "D". A conductive pattern in which a plating film was separated during the plating process or plating was not deposited was evaluated as "E".

TABLE 3

| | | | Example 1 | Example 2 | Example 3 | Example 4 | Example 5 | Example 6 | Example 7 |
|---|---|---|---|---|---|---|---|---|---|
| Gel fraction | After drying at 70° C.; mass % | | 60 | 65 | 60 | 64 | 66 | 65 | 70 |
| | After heating at 150° C.; mass % | | 65 | 75 | 65 | 99 | 100 | 98 | 75 |
| Printing properties | Solvent-based pigment ink | PET | A | A | B | A | A | A | B |
| Fine-line-forming property | Nano-silver ink 1 for ink-jet | PET | A | A | B | A | A | A | B |
| | printing | PI | A | A | B | A | A | A | B |
| | Nano-silver ink 2 for ink-jet | PET | A | A | B | A | A | B | B |
| | printing | PI | A | A | B | A | A | B | B |
| | Silver paste for screen | PET | A | A | A | A | A | B | B |
| | printing | PI | A | A | A | A | A | B | B |
| Electrical conduction property | Nano-silver ink 1 for ink-jet | PET | B | A | B | A | A | A | B |
| | printing | PI | B | A | B | A | A | A | B |
| | Silver paste for screen | PET | B | A | A | A | A | B | B |
| | printing | PI | B | A | A | A | A | B | B |
| Adhesion | | PET | A | A | A | A | A | A | A |
| | | PI | B | A | B | A | A | A | A |
| | | GL | B | A | B | A | A | A | A |
| Durability | Durability after electroless plating process | PI | C | B | B | A | A | B | B |
| | Durability after electrolytic plating process | PI | C | B | B | A | A | B | B |

TABLE 4

| | | | Example 8 | Example 9 | Example 10 | Example 11 | Comparative Example 1 | Comparative Example 2 | Comparative Example 3 |
|---|---|---|---|---|---|---|---|---|---|
| Gel fraction | After drying at 70° C.; mass % | | 74 | 55 | 42 | 63 | 45 | 50 | 20 |
| | After heating at 150° C.; mass % | | 100 | 95 | 94 | 98 | 50 | 61 | 30 |
| Printing properties | Solvent-based pigment ink | PET | B | B | A | B | D | D | E |
| Fine-line-forming property | Nano-silver ink 1 for ink-jet | PET | B | B | A | B | D | D | E |
| | printing | PI | B | B | A | B | D | D | E |
| | Nano-silver ink 2 for ink-jet | PET | B | B | A | B | E | E | E |
| | printing | PI | B | B | A | B | E | E | E |
| | Silver paste for screen | PET | B | B | A | B | E | E | E |
| | printing | PI | B | B | A | B | E | E | E |

TABLE 4-continued

|  |  |  | Example 8 | Example 9 | Example 10 | Example 11 | Comparative Example 1 | Comparative Example 2 | Comparative Example 3 |
|---|---|---|---|---|---|---|---|---|---|
| Electrical conduction property | Nano-silver ink 1 for ink-jet printing | PET | B | B | A | B | D | E | E |
|  |  | PI | B | B | A | B | D | E | E |
|  | Silver paste for screen printing | PET | B | B | A | B | E | D | E |
|  |  | PI | B | B | A | B | E | D | E |
|  | Adhesion | PET | A | A | B | A | D | E | C |
|  |  | PI | A | A | B | B | D | E | C |
|  |  | GL | A | A | B | B | D | E | C |
| Durability | Durability after electroless plating process | PI | A | A | B | B | E | E | D |
|  | Durability after electrolytic plating process | PI | A | A | B | B | — | — | E |

The receiving substrates obtained in Example 1 had excellent adhesion to the polyethylene terephthalate base and good adhesion to the polyimide base and the glass base. The printed matter obtained by performing printing on the receiving substrate with the solvent-based pigment inks had excellent printing properties. Conductive patterns having an excellent fine-line-forming property and a good electrical conduction property could be obtained by performing printing on the receiving substrates with the nano-silver inks.

The receiving substrates obtained in Example 2 had excellent adhesion to the polyethylene terephthalate base, the polyimide base, and the glass base. The printed matter obtained by performing printing on the receiving substrate with the solvent-based pigment inks had excellent printing properties. Conductive patterns having an excellent fine-line-forming property and an excellent electrical conduction property and having durability of such a level that the conductive patterns could withstand the plating processes could be obtained by performing printing on the receiving substrates with the nano-silver inks.

The receiving substrates obtained in Example 3 had excellent adhesion to the polyethylene terephthalate base and good adhesion to the polyimide base and the glass base. The printed matter obtained by performing printing on the receiving substrate with the solvent-based pigment inks had good printing properties. Conductive patterns having a good fine-line-forming property and a good electrical conduction property and having durability of such a level that the conductive patterns could withstand the plating processes could be obtained by performing printing on the receiving substrates with the nano-silver inks.

The receiving substrates obtained in Examples 4 and 5 contained a component that forms a cross-linked structure, and thus had excellent adhesion to the polyethylene terephthalate base, the polyimide base, and the glass base. The printed matter obtained by performing printing on the receiving substrate with the solvent-based pigment inks had excellent printing properties. Conductive patterns having an excellent fine-line-forming property and an excellent electrical conduction property and having durability of such a level that the conductive patterns could withstand the plating processes could be obtained by performing printing on the receiving substrates with the nano-silver inks.

In the receiving substrates obtained in Example 6, a cross-linking agent was used in combination. Thus, the receiving substrates obtained in Example 6 had excellent adhesion to the polyethylene terephthalate base, the polyimide base, and the glass base. The printed matter obtained by performing printing on the receiving substrate with the solvent-based pigment inks had excellent printing properties. Conductive patterns having a good fine-line-forming property and a good electrical conduction property and having durability of such a level that the conductive patterns could withstand the plating processes could be obtained by performing printing on the receiving substrates with the nano-silver inks.

In the receiving substrates obtained in Example 7, a cross-linking agent was used in combination. Thus, the receiving substrates obtained in Example 7 had excellent adhesion to the polyethylene terephthalate base, the polyimide base, and the glass base. The printed matter obtained by performing printing on the receiving substrate with the solvent-based pigment inks had good printing properties. Conductive patterns having a good fine-line-forming property and a good electrical conduction property and having durability of such a level that the conductive patterns could withstand the plating processes could be obtained by performing printing on the receiving substrates with the nano-silver inks.

The receiving substrates obtained in Examples 8 and 9 had excellent adhesion to the polyethylene terephthalate base, the polyimide base, and the glass base. The printed matter obtained by performing printing on the receiving substrate with the solvent-based pigment inks had good printing properties. Conductive patterns having a good fine-line-forming property and a good electrical conduction property and having durability of such a level that the conductive patterns could withstand the plating processes could be obtained by performing printing on the receiving substrates with the nano-silver inks.

The receiving substrates obtained in Example 10 had good adhesion to the polyethylene terephthalate base, the polyimide base, and the glass base. The printed matter obtained by performing printing on the receiving substrate with the solvent-based pigment inks had excellent printing properties. Conductive patterns having an excellent fine-line-forming property and an excellent electrical conduction property and having durability of such a level that the conductive patterns could withstand the plating processes could be obtained by performing printing on the receiving substrates with the nano-silver inks.

The receiving substrates obtained in Example 11 had excellent adhesion to the polyethylene terephthalate base and good adhesion to the polyimide base and the glass base. The printed matter obtained by performing printing on the receiving substrate with the solvent-based pigment inks had good printing properties. Conductive patterns having a good fine-line-forming property and a good electrical conduction property and having durability of such a level that the conductive patterns could withstand the plating processes could be obtained by performing printing on the receiving substrate with the nano-silver inks.

In contrast, the receiving substrates obtained in Comparative Example 1, the receiving substrates being prepared by using a urethane resin having an alicyclic structure in a ratio of 2,000 mmol/kg or less, did not have sufficient adhesion to the polyethylene terephthalate base, the polyimide base, and the glass base in terms of practical use. The printed matter obtained by performing printing on the receiving substrate with the solvent-based pigment inks also did not have satisfactory printing properties, specifically, for example, bleeding occurred in the printed matter. Furthermore, when printing was conducted on the receiving substrates with the nano-silver inks, for example, bleeding of an image line occurred in some cases. Thus, conductive patterns having a good fine-line-forming property and a good electrical conduction property could not be obtained.

The receiving substrates obtained in Comparative Example 2, the receiving substrates being prepared by using a urethane resin having an alicyclic structure in a ratio of more than 5,500 mmol/kg, did not have sufficient adhesion to the polyethylene terephthalate base, the polyimide base, and the glass base in terms of practical use. The printed matter obtained by performing printing on the receiving substrate with the solvent-based pigment inks also did not have satisfactory printing properties, specifically, for example, bleeding occurred in the printed matter. Furthermore, when printing was conducted on the receiving substrates with the nano-silver inks, for example, bleeding of an image line occurred in some cases. Thus, conductive patterns having a good fine-line-forming property and a good electrical conduction property could not be obtained.

The receiving substrates obtained in Comparative Example 3, the receiving substrates containing no vinyl polymer, did not have sufficient adhesion to the polyethylene terephthalate base, the polyimide base, and the glass base in terms of practical use. The printed matter obtained by performing printing on the receiving substrate with the solvent-based pigment inks also did not have satisfactory printing properties, specifically, for example, bleeding occurred in the printed matter. Furthermore, when printing was conducted on the receiving substrates with the nano-silver inks, for example, bleeding of an image line occurred in some cases. Thus, conductive patterns having a good fine-line-forming property and a good electrical conduction property could not be obtained.

The invention claimed is:

1. A printed matter comprising a receiving substrate comprising a support and a receiving layer provided onto part of or an entire surface of the support, wherein the receiving layer is formed by using a resin composition containing a urethane resin (A) having an alicyclic structure in an amount of 2,000 to 5,500 mmol/kg and a hydrophilic group, a vinyl polymer (B), and an aqueous medium (C), wherein the printed matter is produced by performing printing on the receiving layer with a fluid containing a conductive substance or a pigment.

2. The printed matter according to claim 1, wherein the printing is performed by an ink-jet printing method, a screen printing method, a letterpress reverse printing method, or a gravure off-set printing method.

3. The printed matter according to claim 1, wherein in the resin composition, the urethane resin (A) and the vinyl polymer (B) form a composite resin particle (D) constituted by a shell layer composed of the urethane resin (A) and a core layer composed of the vinyl polymer (B).

4. The printed matter according to claim 1, wherein in the resin composition, the vinyl polymer (B) is obtained by polymerizing a vinyl monomer mixture containing 10% to 70% by mass of methyl methacrylate and 10% to 50% by mass of a (meth)acrylic acid alkyl ester having an alkyl group having 2 to 12 carbon atoms.

5. The printed matter according to claim 3, wherein a mass ratio (A)/(B) of the urethane resin (A) and the vinyl polymer (B) that constitute the composite resin particle (D) is in the range of 70/30 to 10/90.

6. The printed matter according to claim 1, wherein in the resin composition, the vinyl resin (B) has a cross-linkable functional group.

7. The printed matter according to claim 6, wherein the cross-linkable functional group is at least one thermally cross-linkable functional group selected from the group consisting of a methylolamide group and alkoxymethylamide groups.

8. The printed matter according to claim 6, wherein the resin composition further comprises a cross-linking agent (E), wherein the cross-linking agent (E) undergoes a cross-linking reaction when heated to 100° C. or higher.

9. The printed matter according to claim 1, wherein the resin composition further comprises a cross-linking agent (E), wherein the cross-linking agent (E) undergoes a cross-linking reaction when heated to 100° C. or higher.

10. The printed matter according to claim 9, wherein the cross-linking agent (E) is at least one thermal cross-linking agent (e1-2) selected from the group consisting of melamine compounds, epoxy compounds, oxazoline compounds, carbodiimide compounds, and isocyanate compounds.

11. A method for producing printed matter according to claim 1 comprising:
   applying a resin composition onto part of or an entire surface of a support, wherein the resin composition contains a urethane resin (A) having an alicyclic structure in an amount of 2,000 to 5,500 mmol/kg and a hydrophilic group, a vinyl polymer (B), and an aqueous medium (C);
   drying the resin composition under a condition in which the resin composition does not undergo a cross-linking reaction to form a receiving layer;
   performing printing on a surface of the receiving layer with a fluid containing a conductive substance or a pigment.

12. The method according to claim 11, further comprising heating the receiving layer on which the printing has been performed to form a cross-linked structure.

13. A method for producing a conductive pattern comprising:
   applying a resin composition onto part of or an entire surface of a support, wherein the resin composition contains a urethane resin (A) having an alicyclic structure in an amount of 2,000 to 5,500 mmol/kg and a hydrophilic group, a vinyl polymer (B), and an aqueous medium (C);
   drying the resin composition under a condition in which the resin composition does not undergo a cross-linking reaction to form a receiving layer;
   performing printing on a surface of the receiving layer with a fluid containing a conductive substance or a pigment to form a printed portion composed of the conductive substance contained in the fluid;
   heating the receiving layer on which the printing has been performed to form a cross-linked structure; and
   then plating the printed portion formed on the surface of the receiving layer.

14. A conductive pattern comprising a receiving substrate comprising a support and a receiving layer provided onto part of or an entire surface of the support, wherein the receiving layer is formed by using a resin composition containing a urethane resin (A) having an alicyclic structure in an amount of 2,000 to 5,500 mmol/kg and a hydrophilic group, a vinyl polymer (B), and an aqueous medium (C), wherein the conductive pattern is produced by performing printing on the receiving layer with a fluid composed of a conductive ink containing a conductive substance, or a plating nucleus agent containing a conductive substance.

15. The conductive pattern according to claim 14, wherein printing on the receiving layer is followed by forming a cross-linked structure in the receiving layer on which the printing has been performed.

16. The conductive pattern according to claim 14, wherein the conductive pattern is produced by additionally performing an electrolytic plating process or an electroless plating process on a surface of a printed portion formed by printing with the fluid.

17. An electrically conductive circuit comprising the conductive pattern according to claim 14.

* * * * *